US007176505B2

(12) United States Patent
Rueckes et al.

(10) Patent No.: US 7,176,505 B2
(45) Date of Patent: *Feb. 13, 2007

(54) ELECTROMECHANICAL THREE-TRACE JUNCTION DEVICES

(75) Inventors: Thomas Rueckes, Boston, MA (US); Brent M. Segal, Woburn, MA (US); Claude Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 282 days.

This patent is subject to a terminal disclaimer.

(21) Appl. No.: 10/802,900

(22) Filed: Mar. 17, 2004

(65) Prior Publication Data

US 2004/0164289 A1    Aug. 26, 2004

Related U.S. Application Data

(63) Continuation-in-part of application No. 10/033,323, filed on Dec. 28, 2001, now Pat. No. 6,911,682.

(51) Int. Cl.
H01L 27/10 (2006.01)
(52) U.S. Cl. .................. 257/209; 257/208; 977/932; 977/936
(58) Field of Classification Search .............. 257/1, 257/202, 208, 209; 977/724, 733, 932, 936
See application file for complete search history.

(56) References Cited

U.S. PATENT DOCUMENTS 3,448,302 A    6/1969   Shanefield .................. 307/318
3,740,494 A    6/1973   Dunand et al.
3,892,890 A    7/1975   Watanabe et al.
3,970,887 A    7/1976   Smith et al. ................. 313/309

(Continued)

FOREIGN PATENT DOCUMENTS

EP    0 269 225 A2    6/1988

(Continued)

OTHER PUBLICATIONS

Ayayan, P.M., et al., "Nanometre-size tubes of carbon," Rep. Prog. Phys, 1997, vol. 60, pp. 1025-1062.

(Continued)

*Primary Examiner*—Bradley K. Smith
(74) *Attorney, Agent, or Firm*—Wilmer Cutler Pickering Hale and Dorr LLP

(57) ABSTRACT

Three trace electromechanical circuits and methods of using same. A circuit includes first and second electrically conductive elements with a nanotube ribbon (or other electromechanical elements) disposed therebetween. An insulative layer is disposed on one of the first and second conductive elements. The nanotube ribbon is movable toward at least one of the first and second electrically conductive elements in response to electrical stimulus applied to at least one of the first and second electrically conductive elements and the nanotube ribbon. Such circuits may be formed into arrays of cells. One of the conductive elements may be used to create an attractive force to cause the nanotube ribbon to contact a conductive element, and the other of the conductive elements may be used to create an attractive force to pull the nanotube ribbon from contact with the contacted conductive element. The electrically conductive traces may be aligned or unaligned with one another.

21 Claims, 25 Drawing Sheets

U.S. PATENT DOCUMENTS

| | | | |
|---|---|---|---|
| 4,324,814 A | 4/1982 | Reichert | 427/86 |
| 4,378,629 A | 4/1983 | Bozlev et al. | 29/580 |
| 4,495,511 A | 1/1985 | Yoder | 357/22 |
| 4,510,016 A | 4/1985 | Chi et al. | 156/643 |
| 4,524,431 A | 6/1985 | Haken et al. | |
| 4,673,474 A | 6/1987 | Ogawa | 204/157.64 |
| 4,694,427 A | 9/1987 | Miyamoto et al. | |
| 4,701,842 A | 10/1987 | Olnowich | 364/200 |
| 4,707,197 A | 11/1987 | Hensel et al. | 437/189 |
| 4,758,534 A | 7/1988 | Derkits, Jr. et al. | 437/89 |
| 4,819,212 A | 4/1989 | Nakai et al. | |
| 4,845,533 A | 7/1989 | Pryor et al. | 357/2 |
| 4,853,893 A | 8/1989 | Eaton, Jr. et al. | 365/145 |
| 4,876,667 A | 10/1989 | Ross et al. | 365/113 |
| 4,888,630 A | 12/1989 | Paterson | 357/23.5 |
| 4,901,121 A | 2/1990 | Gibson et al. | 357/15 |
| 4,903,090 A | 2/1990 | Yokoyama | 357/22 |
| 4,939,556 A | 7/1990 | Eguchi et al. | 357/4 |
| 4,947,226 A | 8/1990 | Huang et al. | |
| 4,979,149 A | 12/1990 | Popovic et al. | |
| 4,985,871 A | 1/1991 | Catlin | 365/230.06 |
| 5,010,037 A | 4/1991 | Lin et al. | 437/200 |
| 5,031,145 A | 7/1991 | Lever | |
| 5,032,538 A | 7/1991 | Bozler et al. | 437/83 |
| 5,051,956 A | 9/1991 | Burns | |
| 5,057,883 A | 10/1991 | Noda | 357/22 |
| 5,089,545 A | 2/1992 | Pol | 524/17 |
| 5,155,561 A | 10/1992 | Bozler et al. | 357/22 |
| 5,168,070 A | 12/1992 | Luth | 437/31 |
| 5,175,597 A | 12/1992 | Cachier et al. | 257/267 |
| 5,184,320 A | 2/1993 | Dye | 365/49 |
| 5,196,396 A | 3/1993 | Lieber | 505/1 |
| 5,198,390 A | 3/1993 | MacDonald et al. | 437/203 |
| 5,198,994 A | 3/1993 | Natori | 365/145 |
| 5,216,631 A | 6/1993 | Sliwa | 365/174 |
| 5,252,835 A | 10/1993 | Lieber et al. | 250/492.1 |
| 5,290,715 A | 3/1994 | Pardya | 437/29 |
| 5,316,979 A | 5/1994 | MacDonald et al. | 437/203 |
| 5,346,683 A | 9/1994 | Green et al. | 423/447.2 |
| 5,412,785 A | 5/1995 | Skruhak et al. | 395/375 |
| 5,424,054 A | 6/1995 | Bethune et al. | 423/447.2 |
| 5,426,070 A | 6/1995 | Shaw et al. | 437/203 |
| 5,444,421 A | 8/1995 | Carroll et al. | 331/111 |
| 5,444,651 A | 8/1995 | Yamamoto et al. | 365/108 |
| 5,453,970 A | 9/1995 | Rust et al. | 396/176 |
| 5,456,986 A | 10/1995 | Majetich et al. | 428/403 |
| 5,475,341 A | 12/1995 | Reed | 327/566 |
| 5,479,172 A | 12/1995 | Smith et al. | 342/51 |
| 5,482,601 A | 1/1996 | Ohshima et al. | 204/173 |
| 5,517,194 A | 5/1996 | Carroll et al. | 342/50 |
| 5,521,602 A | 5/1996 | Carroll et al. | 342/50 |
| 5,533,061 A | 7/1996 | Smith et al. | 375/334 |
| 5,538,916 A | 7/1996 | Kuroi et al. | |
| 5,547,748 A | 8/1996 | Ruoff et al. | 428/323 |
| 5,553,099 A | 9/1996 | Carroll et al. | 375/334 |
| 5,563,424 A | 10/1996 | Yang et al. | 257/40 |
| 5,586,286 A | 12/1996 | Santeler et al. | 395/432 |
| 5,589,692 A | 12/1996 | Reed | 257/23 |
| 5,590,078 A | 12/1996 | Chatter | 365/189.01 |
| 5,592,642 A | 1/1997 | Thomas | |
| 5,592,643 A | 1/1997 | Thomas | |
| 5,592,644 A | 1/1997 | Thomas | |
| 5,608,246 A | 3/1997 | Yeager et al. | 257/295 |
| 5,608,888 A | 3/1997 | Purcell et al. | 395/412 |
| 5,623,638 A | 4/1997 | Andrade | 395/494 |
| 5,626,670 A | 5/1997 | Varshney et al. | 117/7 |
| 5,626,812 A | 5/1997 | Ebbesen et al. | 264/248 |
| 5,640,133 A | 6/1997 | MacDonald et al. | 333/197 |
| 5,640,343 A | 6/1997 | Gallagher et al. | 365/171 |
| 5,650,958 A | 7/1997 | Gallagher et al. | 365/173 |
| 5,651,126 A | 7/1997 | Bailey et al. | 395/401 |
| 5,652,856 A | 7/1997 | Santeler et al. | 395/432 |
| 5,699,317 A | 12/1997 | Sartore et al. | 365/230.06 |
| 5,716,708 A | 2/1998 | Lagow | 428/408 |
| 5,719,073 A | 2/1998 | Shaw et al. | 437/228 |
| 5,721,862 A | 2/1998 | Sartore et al. | 395/445 |
| 5,739,057 A | 4/1998 | Tiwari et al. | 438/172 |
| 5,747,180 A | 5/1998 | Miller et al. | 428/601 |
| 5,751,156 A | 5/1998 | Muller et al. | 324/699 |
| 5,753,088 A | 5/1998 | Olk | 204/173 |
| 5,780,101 A | 7/1998 | Nolan et al. | 427/216 |
| 5,781,717 A | 7/1998 | Wu et al. | 395/182.06 |
| 5,793,697 A | 8/1998 | Scheuerlein | 365/230.07 |
| 5,799,209 A | 8/1998 | Chatter | 395/876 |
| 5,802,583 A | 9/1998 | Yeager et al. | 711/152 |
| 5,838,165 A | 11/1998 | Chatter | 326/38 |
| 5,840,435 A | 11/1998 | Lieber et al. | 428/698 |
| 5,841,692 A | 11/1998 | Gallagher et al. | 365/173 |
| 5,846,849 A | 12/1998 | Shaw et al. | 438/52 |
| 5,847,454 A | 12/1998 | Shaw et al. | 257/734 |
| 5,847,565 A | 12/1998 | Narayanan | 324/322 |
| 5,850,089 A | 12/1998 | Varshney et al. | 257/295 |
| 5,850,231 A | 12/1998 | Orimoto et al. | 345/507 |
| 5,858,862 A | 1/1999 | Westwater et al. | 438/503 |
| 5,875,451 A | 2/1999 | Joseph | 711/105 |
| 5,878,840 A | 3/1999 | Tessum et al. | 182/229 |
| 5,887,272 A | 3/1999 | Sartore et al. | 711/105 |
| 5,897,945 A | 4/1999 | Lieber et al. | 428/323 |
| 5,903,010 A | 5/1999 | Flory et al. | 257/24 |
| 5,914,553 A | 6/1999 | Adams et al. | 310/309 |
| 5,925,465 A | 7/1999 | Ebbesen et al. | 428/408 |
| 5,928,450 A | 7/1999 | Russell | 156/169 |
| 5,930,164 A | 7/1999 | Zhu | 365/158 |
| 5,939,785 A | 8/1999 | Klonis et al. | 257/729 |
| 5,946,228 A | 8/1999 | Abraham et al. | 365/173 |
| 5,946,930 A | 9/1999 | Anthony | 62/293 |
| 5,973,444 A | 10/1999 | Xu et al. | 313/309 |
| 5,985,446 A | 11/1999 | Lagow | 428/367 |
| 5,993,697 A | 11/1999 | Cohen et al. | 252/502 |
| 5,994,733 A | 11/1999 | Nishioka et al. | |
| 5,997,832 A | 12/1999 | Lieber et al. | 423/249 |
| 6,025,618 A | 2/2000 | Chen | 257/295 |
| 6,031,711 A | 2/2000 | Tennent et al. | 361/303 |
| 6,031,756 A | 2/2000 | Gimzewski et al. | 365/151 |
| 6,036,774 A | 3/2000 | Lieber et al. | 117/105 |
| 6,038,060 A | 3/2000 | Crowley | 359/328 |
| 6,038,637 A | 3/2000 | Berube et al. | 711/105 |
| 6,044,008 A | 3/2000 | Choi | 365/145 |
| 6,048,740 A | 4/2000 | Hsu et al. | |
| 6,049,856 A | 4/2000 | Bolyn | 711/168 |
| 6,051,866 A | 4/2000 | Shaw et al. | 257/417 |
| 6,052,263 A | 4/2000 | Gill | 360/113 |
| 6,052,313 A | 4/2000 | Atsumi et al. | |
| 6,060,724 A | 5/2000 | Flory et al. | 257/24 |
| 6,062,931 A | 5/2000 | Chuang et al. | |
| 6,063,243 A | 5/2000 | Zettl et al. | 204/164 |
| 6,064,107 A | 5/2000 | Yeh et al. | |
| 6,069,380 A | 5/2000 | Chou et al. | 257/315 |
| 6,072,718 A | 6/2000 | Abraham et al. | 365/173 |
| 6,083,624 A | 7/2000 | Hiura | 428/408 |
| 6,087,293 A | 7/2000 | Carnahan et al. | |
| 6,088,760 A | 7/2000 | Walker et al. | 711/104 |
| 6,100,109 A | 8/2000 | Melzner et al. | 438/53 |
| 6,104,633 A | 8/2000 | Abraham et al. | 365/171 |
| 6,105,381 A | 8/2000 | Ghoshal | 62/259.2 |
| 6,108,725 A | 8/2000 | Chatter | 710/56 |
| 6,128,214 A | 10/2000 | Kuekes et al. | 365/151 |
| 6,136,160 A | 10/2000 | Hrkut et al. | 204/192.16 |
| 6,138,219 A | 10/2000 | Soman et al. | 711/149 |
| 6,144,481 A | 11/2000 | Kowarz et al. | 359/291 |
| 6,146,227 A | 11/2000 | Mancevski | 445/24 |
| 6,156,256 A | 12/2000 | Kennel | 264/461 |
| 6,159,620 A | 12/2000 | Heath et al. | 428/615 |
| 6,159,742 A | 12/2000 | Lieber et al. | 436/164 |

| | | | |
|---|---|---|---|
| 6,165,890 A | 12/2000 | Kohl et al. | |
| 6,166,948 A | 12/2000 | Parkin et al. ............... 365/173 | |
| 6,177,703 B1 | 1/2001 | Cunningham | |
| 6,183,714 B1 | 2/2001 | Smalley et al. .......... 423/447.3 | |
| 6,187,823 B1 | 2/2001 | Haddon et al. ................ 516/32 | |
| 6,190,634 B1 | 2/2001 | Lieber et al. ................ 423/439 | |
| 6,198,655 B1 | 3/2001 | Heath et al. ................. 365/151 | |
| 6,203,814 B1 | 3/2001 | Fisher et al. ................. 424/443 | |
| 6,203,864 B1 | 3/2001 | Zhang et al. ................. 427/592 | |
| 6,212,597 B1 | 4/2001 | Conlin et al. ................ 711/105 | |
| 6,219,212 B1 | 4/2001 | Gill et al. ................. 360/324.2 | |
| 6,221,330 B1 | 4/2001 | Moy et al. ................. 423/447.3 | |
| 6,226,722 B1 | 5/2001 | Shippy et al. ............... 711/168 | |
| 6,231,744 B1 | 5/2001 | Ying et al. ................... 205/324 | |
| 6,231,980 B1 | 5/2001 | Cohen et al. ................ 428/402 | |
| 6,232,706 B1 | 5/2001 | Dai et al. | |
| 6,233,665 B1 | 5/2001 | Bolyn ........................ 711/168 | |
| 6,237,130 B1 | 5/2001 | Soman et al. ................. 716/10 | |
| 6,239,547 B1 | 5/2001 | Uemura et al. ............. 313/495 | |
| 6,250,984 B1 | 6/2001 | Jin et al. ........................ 445/51 | |
| 6,256,767 B1 | 7/2001 | Kuekes et al. | |
| 6,259,277 B1 | 7/2001 | Tour et al. ................... 326/136 | |
| 6,262,469 B1 | 7/2001 | Le et al. | |
| 6,277,318 B1 | 8/2001 | Bower ........................ 264/346 | |
| 6,300,205 B1 | 10/2001 | Fulford et al. | |
| 6,314,019 B1 | 11/2001 | Kuekes et al. | |
| 6,320,428 B1 | 11/2001 | Atsumi et al. | |
| 6,322,713 B1 | 11/2001 | Choi et al. | |
| 6,325,909 B1 | 12/2001 | Li et al. | |
| 6,331,209 B1 | 12/2001 | Jang et al. | |
| 6,333,016 B1 | 12/2001 | Resasco et al. .......... 423/447.3 | |
| 6,346,413 B1 | 2/2002 | Fodor et al. | |
| 6,348,295 B1 | 2/2002 | Griffith et al. | |
| 6,348,700 B1 | 2/2002 | Ellenbogen et al. | |
| 6,350,488 B1 | 2/2002 | Lee et al. | |
| 6,354,133 B1 | 3/2002 | Yedur et al. .................. 73/1.89 | |
| 6,358,756 B1 | 3/2002 | Sandhu et al. | |
| 6,361,861 B2 | 3/2002 | Gao et al. | |
| 6,362,073 B2 | 3/2002 | Kim | |
| 6,380,434 B1 | 4/2002 | Chiang | |
| 6,400,088 B1 | 6/2002 | Livingston et al. | |
| 6,400,091 B1 | 6/2002 | Deguchi et al. | |
| 6,406,776 B1 | 6/2002 | D'Evelyn | |
| 6,407,443 B2 | 6/2002 | Chen et al. .................. 257/616 | |
| 6,413,487 B1 | 7/2002 | Resasco et al. .......... 423/447.3 | |
| 6,417,606 B1 | 7/2002 | Nakamoto et al. | |
| 6,420,726 B2 | 7/2002 | Choi et al. | |
| 6,421,271 B1 | 7/2002 | Gogl et al. | |
| 6,422,450 B1 | 7/2002 | Zhou et al. | |
| 6,423,583 B1 | 7/2002 | Avouris et al. | |
| 6,426,134 B1 | 7/2002 | Lavin et al. | |
| 6,432,740 B1 | 8/2002 | Chen ............................ 438/99 | |
| 6,443,901 B1 | 9/2002 | Fraser ........................ 500/459 | |
| 6,445,006 B1 | 9/2002 | Brandes et al. ............... 257/76 | |
| 6,495,116 B1 | 12/2002 | Herman .................... 423/447.3 | |
| 6,495,258 B1 | 12/2002 | Chen et al. .................. 428/408 | |
| 6,515,339 B2 | 2/2003 | Shin et al. ................... 257/368 | |
| 6,518,156 B1 | 2/2003 | Chen et al. .................. 438/597 | |
| 6,541,309 B2 | 4/2003 | Chen ............................ 438/118 | |
| 6,548,841 B2 | 4/2003 | Frazier et al. | |
| 6,566,983 B2 | 5/2003 | Shin .......................... 333/193 | |
| 6,574,130 B2 | 6/2003 | Segal et al. .................. 365/129 | |
| 6,586,965 B2 | 7/2003 | Kuekes ........................ 326/37 | |
| 6,611,033 B2 | 8/2003 | Hsu et al. ................... 257/414 | |
| 6,706,402 B2 | 3/2004 | Rueckes et al. | |
| 6,803,840 B2 | 10/2004 | Hunt et al. | |
| 6,809,465 B2 | 10/2004 | Jin | |
| 2001/0004979 A1 | 6/2001 | Han et al. ...................... 216/4 | |
| 2001/0023123 A1 | 9/2001 | Kim | |
| 2001/0023986 A1 | 9/2001 | Mancevski | |
| 2002/0055010 A1 | 5/2002 | Gao et al. | |
| 2002/0061441 A1 | 5/2002 | Ogura et al. | |
| 2002/0068170 A1 | 6/2002 | Smalley et al. | |
| 2002/0081380 A1 | 6/2002 | Dillon et al. | |
| 2002/0081787 A1 | 6/2002 | Kohl et al. | |
| 2002/0088938 A1 | 7/2002 | Colbert et al. | |
| 2002/0090331 A1 | 7/2002 | Smalley et al. | |
| 2002/0092983 A1 | 7/2002 | Colbert et al. | |
| 2002/0092984 A1 | 7/2002 | Colbert et al. | |
| 2002/0096634 A1 | 7/2002 | Colbert et al. | |
| 2002/0098135 A1 | 7/2002 | Smalley et al. | |
| 2002/0102193 A1 | 8/2002 | Smalley et al. | |
| 2002/0102194 A1 | 8/2002 | Smalley et al. | |
| 2002/0102196 A1 | 8/2002 | Smalley et al. | |
| 2002/0102353 A1 | 8/2002 | Mauthner et al. | |
| 2002/0112814 A1 | 8/2002 | Hafner et al. ............ 156/272.2 | |
| 2002/0125805 A1 | 9/2002 | Hsu ........................... 313/309 | |
| 2002/0130353 A1 | 9/2002 | Lieber et al. ................ 257/315 | |
| 2002/0160111 A1 | 10/2002 | Sun et al. .................. 427/248.1 | |
| 2002/0172639 A1 | 11/2002 | Horiuchi .................. 423/477.2 | |
| 2002/0173083 A1 | 11/2002 | Avouris et al. ............. 438/129 | |
| 2002/0175323 A1 | 11/2002 | Guillom et al. ................ 257/10 | |
| 2002/0175390 A1 | 11/2002 | Goldstein et al. ........... 257/481 | |
| 2002/0179434 A1 | 12/2002 | Dai et al. .................... 204/242 | |
| 2003/0004058 A1 | 1/2003 | Li et al. ..................... 502/258 | |
| 2003/0021966 A1 | 1/2003 | Segal et al. .................. 428/209 | |
| 2003/0108480 A1 | 6/2003 | Baker et al. ............. 432/447.3 | |
| 2003/0124325 A1 | 7/2003 | Rueckes et al. | |
| 2003/0124837 A1 | 7/2003 | Rueckes et al. ............. 438/629 | |
| 2004/0159833 A1 | 8/2004 | Rueckes et al. | |
| 2004/0175856 A1 | 9/2004 | Jaiprakash et al. | |
| 2004/0181630 A1 | 9/2004 | Jaiprakash et al. | |

FOREIGN PATENT DOCUMENTS

| | | |
|---|---|---|
| EP | 0 269 225 A3 | 6/1988 |
| EP | 441409 A3 | 7/1988 |
| EP | 441409 B1 | 7/1988 |
| EP | 0 315 392 A2 | 5/1989 |
| EP | 0 315 392 A3 | 5/1989 |
| EP | 0 613 130 A1 | 8/1994 |
| EP | 0 665 187 A1 | 8/1995 |
| EP | 0 688 618 A2 | 8/1995 |
| EP | 758028 A3 | 7/1996 |
| EP | 1209123 A2 | 9/1996 |
| EP | 0 665 187 B1 | 12/1997 |
| EP | 0 989 579 A3 | 3/2000 |
| EP | 0 945 402 A1 | 9/2000 |
| EP | 1 046 613 A2 | 10/2000 |
| EP | 1225613 A1 | 10/2000 |
| EP | 1 052 520 A1 | 11/2000 |
| EP | 1 054 249 A1 | 11/2000 |
| EP | 1 059 266 A3 | 12/2000 |
| EP | 1 061 044 A1 | 12/2000 |
| EP | 1 061 544 A1 | 12/2000 |
| EP | 1 061 555 A1 | 12/2000 |
| EP | 1 069 206 A2 | 1/2001 |
| EP | 1 072 693 A1 | 1/2001 |
| EP | 1132920 A2 | 2/2001 |
| EP | 1 100 106 A2 | 5/2001 |
| EP | 1 100 297 A2 | 5/2001 |
| EP | 1096533 | 5/2001 |
| EP | 1205436 A1 | 11/2001 |
| GB | 2364933 A | 7/2001 |
| JP | 11-011917 | 1/1999 |
| WO | WO 95/02709 | 1/1995 |
| WO | WO 96/38410 | 12/1996 |
| WO | WO 96/41043 | 12/1996 |
| WO | WO 97/22971 | 12/1996 |
| WO | WO 97/09272 | 3/1997 |
| WO | WO 97/31139 | 8/1997 |
| WO | WO 97/43473 | 11/1997 |
| WO | WO 98/26871 | 6/1998 |
| WO | WO 98/39250 | 9/1998 |
| WO | WO 98/39251 | 9/1998 |
| WO | WO 98/42620 | 10/1998 |

| | | |
|---|---|---|
| WO | WO 98/48456 | 10/1998 |
| WO | WO 99/06618 | 2/1999 |
| WO | WO 00/09443 | 7/1999 |
| WO | WO 00/08650 | 8/1999 |
| WO | WO 99/47570 | 9/1999 |
| WO | WO 99/48810 | 9/1999 |
| WO | WO 99/58748 | 11/1999 |
| WO | WO 99/65821 | 12/1999 |
| WO | WO 00/09443 | 2/2000 |
| WO | WO 00/17101 | 3/2000 |
| WO | WO 00/19494 | 4/2000 |
| WO | WO 00/63115 | 4/2000 |
| WO | WO 00/73204 | 5/2000 |
| WO | WO 01/03208 | 6/2000 |
| WO | WO 00/44094 | 7/2000 |
| WO | WO 00/48195 | 8/2000 |
| WO | WO 01/18246 | 8/2000 |
| WO | WO 01/23303 | 8/2000 |
| WO | WO 00/63115 | 10/2000 |
| WO | WO 00/73204 | 12/2000 |
| WO | WO 01/03208 | 1/2001 |
| WO | WO 02/37500 | 5/2001 |
| WO | WO 01/44796 | 6/2001 |
| WO | WO 02/19420 | 8/2001 |
| WO | WO 02/38496 | 11/2001 |
| WO | WO 02/42204 | 11/2001 |
| WO | WO 02/48701 | 12/2001 |
| WO | WO 02/48822 | 12/2001 |
| WO | WO 02/054505 | 12/2001 |
| WO | WO 02/059898 | 1/2002 |
| WO | WO 02/060812 | 1/2002 |
| WO | WO 02/060813 | 1/2002 |
| WO | WO 03/091486 | 11/2003 |
| WO | WO 04/065655 | 8/2004 |
| WO | WO 04/065657 | 8/2004 |
| WO | WO 04/065671 | 8/2004 |

OTHER PUBLICATIONS

Winslow, Troy. "Advanced+Boot Block World's First 0.18-Micron Flash Memory." Flash Products Group. Apr. 17, 2000.
"Double Sided 4Mb SRAM Coupled Cap PBGA Card Assembly Guide." International Business Machines Corp. (IBM), 1998.
Tyagi et al. "A 130nm Generation Logic Technology Featuring 70nm Transistors, Dual Vt Transistors and 6 Layers of Cu Interconnects." Portland Technology Development.
"Preliminary: 8Mb (256Kx36 & 512Kx18) and 4Mb (128Kx36 & 256Kx18) [IBM0418A8CBLBB, IBM0418A4CBLBB, IBM0436A8CBLBB, IBM0436A4CBLBB]." International Business Machines Corp. (IBM), 1998.
Wei, Chengyu et al. "Temperature and Stain-Rate Dependent Plastic Deformation of Carbon Nanotube.".
"Package Mechanicals for USAR ICs." USAR Systems, Inc., 1998.
Dipert, Brian. "Exotic Memories, Diverse Approaches." EDN Magazine. Apr. 26, 2001, 56-70.
Duan, Xiangfeng. "Indium Phosphide Nanowires as Building Blocks for Nanoscale Electronic and Optoelectronic Devices." Nature (2001); 409: 66-69.
Yang. "A High Performance 180 nm Generation Logic Technology." Portland Technology Development.
Dai, Hongjie. "Controlled Chemical Routes to Nanotube Architectures, Physics, and Devices." The Journal of Physical Chemistry B (1999); 103: 11246-11255.
Callaby, D. Roy et al. "Solid State Memory Study Final Report." National Media Lab, Feb. 1994.
Cui, Yi. "Doping and Electrical Transport in Silicon Nanowires." The Journal of Physical Chemistry B (2000); vol. 104, No. 22: 5213-5216.
Li, Mingtao et al. "Direct Three-dimensional Patterning Using Nanoimprint Lithography." Applied Physics Letters (2000); vol. 78, No. 21: 3322-3324.

"8 Mb Synchronous Communication SRAM (IBM0418A86LQKA, IBM0418A86SQKA, IBM0436A861QKA, IBM436A86SQKA)." International Business Machines Corp. (IBM), 1999.
Dipert, Brian. "Memory Cards: Designing with a Full Deck." EDN Magazine. May 25, 2000.
Schönenberger, Christian et al. "Physics of Multiwall Carbon Nanotubes." Physics World. Apr. 4, 2000.
Whatmore, Roger W. "Nanotechnology." Ingenia. Feb. 2000.
"Nanochip NC800SX, 0.8 Gbyte Molecular Memory IC (R/W), Nanochip NC200SX, 0.2 Gbyte Molecular Memory IC (R/W), Nanochip NCM4510SX, Molecular Array Read/write Engine, Low Voltage Thermal Actuated, Dynamic Media Series M2, Nanochip NC4525DX, A/D-D/A Interface, Preliminary Specifications, Advance Information, (C) 1996-2000 Nanochip Document NCM2230500.".
Odom, Teri Wang et al. "Atomic Structure and Electronic Properties of Single-Walled Carbon Nanotubes." Nature (1998); 391: 62-64.
Ouyang, Min. "Atomically Resolved Single-Walled Carbon Nanotube Intramolecular Junctions." Science (2001); 291: 97-100.
Odom, Teri Wang et al. "Magnetic Clusters on Single-Walled Carbon Nanotubes: The Kondo Effect in a One-Dimensional Host." Science (2000); 290: 1549-1552.
Wong, Eric et al. "Nanobeam Mechanics: Elasticity, Strength, and Toughness of Nanorods and Nanotubes." Science (1997); 277: 1971-1975.
Hu, Jiangtao et al. "Controlled Growth and Electrical Properties of Heterojunctions of Carbon Nanotubes and Silicon Nanowires." Nature (1999); 399: 48-51.
Rueckes, Thomas et al. "Carbon Nanotube-Based Nonvolatile Random Access Memory for Molecular Computing." Science (2000); 289: 94-7.
Kim, Philip et al. "Nanotube Nanotweezers." Science (1999); 286: 2148-2150.
Huang, Yu et al. "Directed Assembly of One-Dimensional Nanostructures into Functional Networks." Science (2001); 291: 630-33.
Cui, Yi et al. "Functional Nanoscale Electronic Devices Assembled Using Silicon Nanowire Building Blocks." Science (2001);291: 851-53.
Oullette, Jennifer. "Exploiting Molecular Self-Assembly." The Industrial Physicist. American Institute of Physics, Dec. 2000.
Peng, Shu et al. "Chemical Control of Nanotube Electronics." Nanotechnology (2000); 11: 57-60.
"The Ultimate Memory Guide." Kingston Technology (1998).
Morales, Alfredo et al. "A Laser Ablation Method for the Synthesis of Crystalline Semiconductor Nanowires." Science (1998); 279: 208-11.
Franklin, Nathan R. and Hongjie Dai, "An Enhanced CVD Approach to Extensive Nanotube Networks with Directionality." Advanced Materials (2000): 890-894.
Kong, Jing; Chongwu Zhou; Erhan Yenilmez; Hongjie Dai. "Alkaline metal-doped n-type semiconducting nanotubes as quantum dots." AppliedPhysics Letters (Dec. 11, 2000): 3977-3979.
Tombler, Thomas W.; Chongwu Zhou; Jing Kong; Hongjie Dai. "Gating individual nanotubes and crossed with scanning probes." Applied Physics Letters (Apr. 24, 2000): 2412-2414.
Zhou, Chongwu: et al. "Electrical measurements of individual semiconducting single-walled carbon nanotubes of various diameters." Applied Physics Letters (Mar. 20, 2000): 1597-1599.
Zhang, Y. and Hongjie Dai. "Formation of metal nanowires on suspended single-walled carbon nanotubes." Applied Physics Letters (Nov. 6, 2000): 3015-3017.
Chen, Robert J. et al. "Molecular photodesorption from single-walled carbon nanotubes." Applied Physics Letters (Oct. 1, 2001): 2258-2260.
Zhang, Y.et al. "Electric-field-directed growth of aligned single-walled carbon nanotubes." Applied Physics Letters (Nov. 5, 2001): 3155-3157.
Zhang, Y. et al. "Metal coating on suspended carbon nanotubes and its implication to metal-tube interaction." Chemical Physics Letters (Nov. 24, 2000): 35-41.

Chen, Robert J. et al. "Noncovalent Sidewall Functionalization of Single-Walled Carbon Nanotubes for Protein Immobilization." *American Chemical Society* (2001): 3838-3839.

Li, Yiming et al. "Growth of Single-Walled Carbon Nanotubes from Discrete Catalytic Nanoparticles of Various Sizes." *American Chemical Society* (2001).

Cassell, Alan M. et al. "Large Scale CVD Synthesis of Single-Walled Carbon Nanotubes." *American Chemical Society* (1999): 6484-6492.

Fan, Shoushan et al. "Carbon nanotube arrays on silicon substrates and their possible application." *Physica E* (2000): 179-183.

Liu, Lei et al. "Controllable Reversibility of an sp2 to sp3 Transition of a single Wall Nanotube under the Manipulation of an AFM Tip." *Physical Review Letters* (May 22, 2000): 4950-4953.

Kong, Jing et al. "Quantum Interference and Ballistic Transmission in Nanotube Electron Waveguides." *Physical Review Letters* (Sep. 3, 2001); 87, 106801(4).

Liu, C. et al. "Synthesis of Macroscopically Long Ropes of Well-Aligned Single-Walled Carbon Nanotubes." *Advanced Materials* (Aug. 16, 2000); 12, 1190-1192.

Kiang, Ching-Hwa. "Growth of Large-Diameter Single-Walled Carbon Nanotubes." *American Chemical Society* (2000); 104, 2454-2456.

Cheung, Chin Li et al. "Growth and fabrication with single-walled carbon nanotube probe microscopy tips." *Applied Physics Letters* (2000); 76, 3136-3138.

Bozovic, Dolores et al. "Electronic properties of mechanically induced kinds on single-walled carbon nanotubes." *Applied Physics Letters* (Jun. 4, 2001); 78, 3693-3695.

Hafner, Jason H. et al. "High-Yield Assembly of Individual Single-Walled Carbon Nanotube Tips for Scanning Prone Microscopies." *The Journal of Physical Chemistry* (Feb. 1, 2001); 105, 743-746.

Hafner, J.H. et al. "Structural and functional imaging with carbon nanotube AFM probes." *Progress in Biophysics & Molecular Biology* (2001); 77, 73-110.

Jorio, A. et al. "Joint density of electronic states for one isolated single-wall carbon nanotube studied by resonant Raman scattering." *Physical Review B* (2001); 63: 24541(4).

Filho, A. G. Souza et al. "Electronic transition energy Eii for an isolated (n, m) single-wall carbon nanotube obtained by anti-Stokes/Stokes resonant Raman intensity ratio." *Physical Review* (2002); 63, 241404(4).

Saito, R. et al. "Chirality-dependent G-band Raman intensity of carbon nanotubes." *Physical Review* (2001); 64, 085312(7).

Jorio, A. et al. "Structural (n, m) Determination of Isolated Single-Wall Carbon Nanotubes by Resonant Raman Scattering." *Physical Review Letters* (Feb. 5, 2001); 86, 1118-1121.

Woolley, Adam T. et al. "Structural biology with carbon nanotube AFM probes." *Chemistry & Biology* (2000); 7, R193-204.

Li, Yan et al. "Preparation of Monodispersed Fe-Mo Nanoparticles as the Catalyst for CVD Synthesis of Carbon Nanotubes." *Chemical Material* (2001): 13; 1008-1014.

Rao, C. N. R. et al. "Nanotubes." *CHEMPHYCHEM* (2001); 2, 78-105.

Nerushev, Oleg A. et al. "Carbon nanotube films obtained by thermal chemical vapor deposition." *Journal of Chemistry Materials* (2001); 11, 1122-1132.

Flahaut, E. et al. "Synthesis of single-walled carbon nanotube-Co—MgO composite powders and extraction of the nanotubes." *Journal of Chemical Materials* (2000); 10, 249-252.

Dresselhaus, Mildred S. and Phaedon Avouris. "Introduction to Carbon Materials Research." *Topics Applied Physics* (2001); 80, 1-9.

Dresselhaus, Mildred S. and Morinobu Endo. "Relation of Carbon Nanotubes to Other Carbon Materials." *Topics in Applied Physics* (2001); 80, 11-28.

Dai, Hongjie. "Nanotube Growth and Characterization." *Topics in Applied Physics* (2001); 80, 29-53.

Charlier, Jean-Chrisophe and Sumio Iijima. "Growth Mechanisms of Carbon Nanotubes." *Topics in Applied Physics* (2001); 80, 55-81.

Tenne, Richard and Alex K. Zettl. "Nanotubes from Inorganic Materials." *Topics in Applied Physics* (2001); 80, 81-112.

Louie, Steven G. "Electronic Properties, Junctions, and Defects of Carbon Nanotubes." *Topics in Applied Physics* (2001); 80, 113-145.

Yao, Zhen et al. "Electrical Transport Through Single-Wall Carbon Nanotubes." *Topics in Applied Physics* (2001); 80, 147-171.

Odom, Teri Wang et al. "Scanning Probe Microscopy Studies of Carbon Nanotubes." *Topics in Applied Physics* ((2001); 80, 173-211.

Saito, Riichiro and Hiromichi Kataura. "Optical Properties and Raman Spectroscopy of Carbon Nanotubes." *Topics in Applied Physics* (2001); 80, 213-247.

Fink, Joerg H. and Philippe Lambin. "Electron Spectroscopy Studies of Carbon Nanotubes." *Topics in Applied Physics* (2001); 80, 247-272.

Hone, James. "Phonons and Thermal Properties of Carbon Nanotubes." *Topics of Applied Physics* (2001); 80, 273-286.

Yakobson, Boris I. And Phaedon Avouris. "Mechanical Properties of Carbon Nanotubes." *Topics in Applied Physics* (2001); 80, 287-327.

Forro, Laszlo and Christian Schoenenberger. "Physical Properties of Multi-wall Nanotubes." *Topics in Applied Physics* (2001); 80, 329-391.

Ajayan, Pulickel M. and Otto Z. Zhou. "Applications of Carbon Nanotubes." *Topics in Applied Physics* (2001); 80, 391-425.

Kong, J. et al. "Synthesis, integration, and electrical properties of individual single-walled carbon nanotubes." *Applied Physics A* (1999); 69, 305-308.

Dai, Hongjie et al. "Exploiting the properties of carbon nanotubes for nanolithography." *Applied Physics Letters* (Sep. 14, 1998); 73, 1508-1510.

Soh, Hyongsok T. et al. "Integrated nanotube circuits." *Applied Physics Letters* (Aug. 2, 1999); 75, 627-629.

Bozler, C.O., et al., "Fabrication and Microwave Performance of the Permeable Base Transistor," *IEEE Tech. Dig. Int. Electron Devices Meeting* (1979) 384.

Cheng, H. M. et al. "Large-scale and low-cost synthesis of single-walled carbon nanotubes by the catalytic pyrolysis of hydrocarbons." *Applied Physics Letters* (Jun. 22, 1998); 72, 3282-3284.

Shim, Moonsub et al. "Polymer Functionalization for Air-Stable n-Type Carbon Nanotube Field-Effect Transistors." *Journal of American Chemical Society* (2001); 123, 11512-11513.

Haddon, R. C. "C70 Thin Film Transistors." *Journal of the American Chemical Society* (1996); 118, 3041-3042.

Hafner, Jason H. et al. "Direct Growth of Single-Walled Carbon Nanotube Scanning Probe Microscopy Tips." *Journal of the American Chemical Society* (1999); 121, 9750-9751.

Hafner, Jason H. et al. "Growth of nanotubes for probe microscopy tips." *Scientific Correspondence* (Apr. 29, 1999); 398, 761, 762.

Bekyarova, E. et al. "Oxidation and Porosity Evaluation of Budlike Single-Wall Carbon Nanohorn Aggregates." *American Chemical Society* (2002).

Hafner, Jason H. et al. "Catalytic growth of single-wall carbon nanotubes from metal particles." *Chemical Physics Letters* (Oct. 30, 1998); 296, 195-202.

Cheng, H. M. et al. "Large-scale and low-cost synthesis of single-walled carbon nanotubes by the catalyst pyrolysis of hydrocarbons." *Applied Physics Letters* (Jun. 22, 1998); 72, 3282-3284.

Kiang, Ching-Hwa. "Growth of Large-Diameter Single-Walled Carbon Nanotubes." *Journal of Physical Chemistry A.* (2000); 104, 2454-2456.

Nerushev, Oleg A. et al. "Carbon nanotube films obtained by thermal chemical vapour deposition." *Journal of Material Chemistry* (2001); 11, 1122-1132.

Kong, J. et al. "Synthesis, integration, and electrical properties of individual single-walled carbon nanotubes." *Applied Physics A* (1999); 69, 305-308.

Zhou, Chongwu et al. "Electrical measurements of individual semiconducting single-walled carbon nanotubes of various diameters." *Applied Physics Letters* (Mar. 20, 2000); 76, 1597-1599.

Yu, et al., *J. Phys. Chem. B*, 105;6831-6837 (2001).

Berber, S., *Phys. Rev. Lett*, 84, 4613 (2000).

Bahr, Jeffrey L. and James. M. Tour. "Highly Functionalized Carbon Nanotubes Using in Situ Generated Diazonium Compounds." *Chemical Materials* (2001); 13, 3823-3824.

Peigney, Alain et al. "A Study of the Formation of Single- and Double-Walled Carbon Nanotubes by a CVD Method." *Journal of Physical Chemistry B* (2001); 105, 9699-9710.

Yao, B. D. and N. Wang. "Carbon Nanotube Arrays Prepared by MWCVD." *Journal of Physical Chemistry* (2001); 105, 11395-11398.

Ago, Hiroki et al. "Gas-Phase Synthesis of Single-wall Carbon Nanotubes from Colloidal Solution of Metal Nanoparticles." *Journal of Physical Chemistry B* (Nov. 1, 2001); 105, 10453-10456.

Li, Yiming et al. "Growth of Single-Walled Carbon Nanotubes from Discrete Catalytic Nanoparticles of Various Sizes." *Journal of Physical Chemistry B* (2001); 105, 11424-11431.

Ng, Hou Tee et al. "Soft-Lithography-Mediated Chemical Vapor Deposition of Architectured Carbon Nanotube Networks on Elastomeric Polymer." *American Chemical Society* (2001).

Derycke, V. et al. "Carbon Nanotube Inter-and Intramolecular Logic Gates." *Nano Letters* (Sep. 2001); 1, 453-456.

Erkoc et al., *Int. J. Modern Phys. C*, 12:865-870 (2001).

Benerjee, Sarbajit and Stanislaus S. Wong. "Functionalization of Carbon Nanotubes with a Metal-Containing Molecular Complex." *Nano Letters* (2001); 0, A-E.

Reynoso, J. 391PGA Drawings (3): Project No. 32639103. *Kyocera America, Inc.* (Apr. 12, 1994).

Diehl, Michael R. et al. "Self-Assembled, Deterministic Carbon Nanotube Wiring Networks." *Angew. Chemical International Edition* (2002); 41, 353-356.

Table of Contents for Semiconductor Consulting Services (1999).

Sidorov, S. N. et al. "Cobalt Nanoparticle Formation in the Pores of Hyper-Cross-Linked Polystyrene." *Chemical Materials* (1999); 11, 3210-3215.

Brown, David A. et al. "Kinetics of Inron(III) Chelation from Polynuclear Oxo-Hydroxy Aggregates by Hydroxamic Acids." *Inorganic Chemistry* (1999); 38, 5198-5202.

Douglas, Trevor and Vistoria T. Stark. "Nanophase Cobalt Oxyhydroxide Mineral Synthesized within the Protein Cage of Ferritin." *Inorganic Chemistry* (2000); 39, 1828-1830.

Hatzikonstantinidou et al., *Phys. Scripta* 54: 226-229 (1994).

Cao, Anyuan et al. "Macroscopic Three-Dimensional Arrays of Fe Nanoparticles Supported in Aligned Carbon Nanotubes." *The Journal of Physical Chemistry B* (2001); 105, 11937-11940.

Li, Shoutian et al. "Semiconductor Nanoparticles in Contact: Quenching of the Photoluminescence from Silicon Nanocrystals by WO3 nanoparticles Suspended in Solution." *The Journal of Physical Chemistry B* (1998); 102, 7319-7322.

Zhang, Shengjun et al. "Select Pathways to Caron Nanotube Film Growth." *Advanced Materials* (Dec. 3, 2001); 13, 1767-1770.

Wei, B. Q. et al. "Organized assembly of carbon nanotubes." *Nature* (Apr. 4, 2002); 416, 495-496.

Zhao, Y.-P. et al. "Frequency-dependent electrical transport in carbon nanotubes." *Physical Review B* (2001); 64, 201402(4).

Zhu, H. W. et al. "Direct Synthesis of Long Single-Walled Carbon Nanotube Strands." *Science* (May 3, 2002); 296, 884-886.

Ajayan, P. M. et al. "Nanotubes in a Flash—Ignition and Reconstruction." *Science* (Apr. 26, 2002); 296, 705.

Franklin, Nathan R. et al. "Patterned growth of single-walled carbon nanotubes on full 4-inch wafers." *Applied Physics Letters* (Dec. 31, 2001); 79, 4571-4573.

Fan, Shoushan et al. "Self-Oriented Regular Arrays of Carbon Nanotubes and Their Field Emission Properties." *Science* (Jan. 22, 1999); 283, 512-514.

Sohn, Jung Inn, et al., "Patterned selective growth of carbon nanotubes and large field emission from vertically well-aligned carbon nanotube field emitter arrays." *Appl. Phys. Letters* (Feb. 12, 2001); 78, 901-903.

Postma, Henk W. C. et al. "Manipulation and Imaging of Individual Single-Walled Carbon Nanotubes with an Atomic Force Microscope." *Advanced Materials* (Sep. 1, 2000); 12, 1299-1302.

Chen, J. et al., "Large On-Off Ratios and Negative Differential Resistance in a Molecular Electronic Device," *Science*, vol. 286, Nov. 19, 1999, pp. 1550-1551.

Collier, C.P., et al., "Electronically Configurable Molecular-Based Logic Gates," *Science*, vol. 285, Jul. 16, 1999, pp. 391-394.

"IBM Builds Tiny Transistor that Beats Silicon", *Technology—Reuters*, Yahoo, May 16, 2002.

Yao, Z., et al, *Phys. Rev. Lett*, 84, 2941 (2000).

Tans, Sander J., "Room-temperature transistor based on a single carbon nanotube," Nature, May 1998, vol. 393, pp. 49-52.

Dillon, Anne C., "A Simple and Complete Purification of Single-Walled Carbon Nanotube Materials," Advanced Materials, 1999, vol. 11, pp. 1354-1358.

Cleland, A.N., "Single-crystal aluminum nitride nanomechanical resonators," Applied Physics Letters, Sep. 24, 2001, vol. 79, pp. 2070-2072.

Calleja, M., "Fabrication of gold nanowires on insulating substrates by field-induced mass transport," Applied Physics Letters, Oct. 8, 2001, vol. 79, pp. 2471-2473.

Kluth, P., "Fabrication of epitaxial $CoSi_2$ nanowires," Applied Physics Letters, Aug. 6, 2001, vol. 79, pp. 824-826.

Zhang, Y., "Formation of metal nanowires on suspended single-walled carbon nanotubes," Applied Physics Letters, Nov. 6, 2000, vol. 77, pp. 3015-3017.

Berry, A.D., "Fabrication of GaAs and InAs wires in nanochannel gas," Applied Physics Letters, Nov. 4, 1996, vol. 69, pp. 2846-2848.

Li, Jian-Long, "Spontaneous formation of ordered indium nanowire array on Si(001)," Applied Physics Letters, Oct. 22, 2001, vol. 79, pp. 2826-2828.

Jorritsma, J., "Fabrication of large arrays of metallic nanowires on V-grooved substrates," Applied Physics Letters, Sep. 4, 1995, vol. 67, pp. 1489-1491.

Sekiba, Daiichiro, "Fabrication of stable nanopatterns on metals," Applied Physics Letters, Sep. 30, 2002, vol. 81, pp. 2632-2634.

Yin, A. J., "Fabrication of highly ordered metallic nanowire arrays by electrodeposition," Applied Physics Letters, Aug. 31, 2001, vol. 79, pp. 1039-1041.

He, J. Z., "Dispersion, refinement, and manipulation of single silicon nanowires," Applied Physics Letters, Mar. 11, 2002, vol. 80, pp. 1812-1814.

Franklin, Nathan R., "Integration of suspended carbon nanotube arrays into electronic devices and electromechanical systems," Applied Physics Letters, Jul. 29, 2002, vol. 81, pp. 913-915.

Homma, Yoshikazu, "Growth of suspended carbon nanotube networks on 100-nm-scale silicon pillars," Applied Physics Letters, Sep. 16, 2002, vol. 81, pp. 2261-2263.

Yenilmez, Erhan, "Wafer scale production of carbon nanotube scanning probe tips for atomic force microscopy," Applied Physics Letters, Mar. 25, 2002, vol. 80, pp. 2225-2227.

Sax, Harald, "Polysilicon Overfill Etch Back Using Wet Chemical Spin-process Technology," 7 pgs.

Dinaro, Joanna, "Analysis of an Elementary Reaction Mechanism for Benzene Oxidation in Supercritical Water, Combustion Institute," 2000, vol. 28, pp. 1529-1536.

Monthioux, M., "Sensitivity of single-wall carbon nanotubes to chemical processing: an electron microscopy investigation," Carbon, 2001, vol. 39, pp. 1251-1272.

Hou, P. X., "Multi-step purification of carbon nanotubes," 2002 Elsevier Science Ltd., Mar. 8, 2001, vol. 40, pp. 81-85.

Avouris, P., "Carbon nanotube electronics," Carbon, 2002, vol. 40, pp. 429-445.

Chen, Bin, "Heterogeneous Single-Walled Carbon Nanotube Catalyst Discovery and Optimization," Chemical Materials, Dec. 7, 2001, vol. 14, pp. 1891-1896.

Maurin, I., "Carbon Miscibility in the Boron Layers of the $MgB_2$ Superconductor," Chemical Materials, 2002, pp. A-D.

Hyeon-Lee, Jingyu, "Aero-Sol-Gel Synthesis of Nanostructured Silica Powders," Chemical Materials, 1997, vol. 9, pp. 2400-2403.

McEuen, Paul L., Single-Walled Carbon Nanotube Electronics, to be published in the inaugural issue of the IEEE Transactions on Nanotechnology (2002), 9 pgs.

Dürkop, T., "Nanotubes are High Mobility Semiconductors," Department of Physics, University of Maryland, 4 pgs.

Choi, Hee Cheul, "Spontaneous Reduction of Metal Ions on the Sidewalls of Carbon Nanotubes," J. Amer. Chem. Soc., May 7, 2002, pp. A-B.

Zheng, Bo, "Efficient CVD Growth of Single-Walled Carbon Nanotubes on Surfaces Using Carbon Monoxide Precursor,"Nano Letters, 2002, pp. A-D.

Deng, S. Z., "Synthesis of silicon carbide nanowires in a catalyst-assisted process," Chemical Physics Letters, Apr. 26, 2002, vol. 356, pp. 511-514.

Zhang, R. Q., "Silicon nanotubes: Why not?," Chemical Physics Letters, 2002, vol. 364, pp. 251-258.

Lei, Y., "Fabrication, characterization and Raman study of $TiO_2$ nanowire arrays prepared by anodic oxidative hydrolysis of $TiCl_3$," Chemical Physics Letters, 2001, vol. 338, pp. 231-236.

Zheng, M. J., "Fabrication and optical properties of large-scale uniform zinc oxide nanowire arrays by one-step electrochemical deposition technique," Chemical Physics Letters, 2002, vol. 363, pp. 123-128.

O'Connell, Michael J., "Reversible water-solubilization of single-walled carbon nanotubes by polymer wrapping," Chemical Physics Letters, 2001, vol. 342, pp. 265-271.

Huang, Houjin, "Purification and alignment of arc-synthesis single-walled carbon nanotube bundles," Chemical Physics Letter, 2002, vol. 356, pp. 567-572.

Kong, Jing, "Chemical vapor deposition of methane for single-walled carbon nanotubes," Chemical Physics Letters, 1998, vol. 292, pp. 567-574.

Bergbreiter, David E., "Using Soluble Polymers To Recover Catalysts and Ligands," Chemical Reviews, Mar. 5, 2002, pp. A-AM.

Roucoux, Alain, "Reduced Transition Metal Colloids: A Novel Family of Reusable Catalysts?," Chemical Reviews, Jan. 30, 2002, pp. A-V.

Yoshida, Jun-ichi, "Tag Strategy for Separation and Recovery," Chemical Reviews, Mar. 18, 2002, pp. A-X.

De Vos, Dirk E., "Ordered Mesoporous and Microporous Molecular Sieves Functionalized with Transition Metal Complexes as Catalysts for Selective Organic Transformations," Chemical Reviews, Jan. 31, 2002, pp. A-Z.

Connelly, Neil G., "Chemical Redox Agents for Organometallic Chemistry," Chemical Reviews, Jan. 9, 1996, vol. 96, pp. 877-910.

Dequesnes, Marc, "Calculation of pull-in voltages for carbon-nanotube-based nanoelectromechanical switches," Nanotechnology, Jan. 22, 2002, vol. 13, pp. 120-131.

Serp, Philippe, "Chemical Vapor Deposition Methods for the Controlled Preparation of Supported Catalytic Materials," Chemical Reviews, Apr. 10, 2002, pp. A-AR.

Diehl, Michael R., "Self-Assembled, Deterministic Carbon Nanotube Wiring Networks," Angew. Chem. Int. Ed., 200 vol. 41, pp. 353-356.

Wind, S.J., "Localized and Directed Lateral Growth of Carbon Nanotubes from a Porous Template," IBM T.J. Watson Research Center, 17 pgs.

Wind, S. J., "Fabrication and Electrical Characterization of Top Gate Single-Wall Carbon Nanotube Field-Effect Transistors," IBM T. J. Watson Research Center, 14 pgs.

Harutyunyan, Avetik R., "CVD Synthesis of Single Wall Carbon Nanotubes under "Soft" Conditions," Nano Letters, Feb. 25, 2002, pp. A-F.

Massot, L., "Electrodeposition of carbon films from molten alkaline fluoride media," Electrochimica Acta, Jan. 28, 2002, vol. 47, pp. 1949-1957.

Heinze, S., "Carbon Nanotubes as Schottky Barrier Transistors," Physical Review Letters, Sep. 2, 2002, vol. 89, pp. 106801-1 through 106801-4.

Duan, Xiangfeng, "Indium phosphide nanowires as building blocks for nanoscale electronic and optoelectronic devices," Nature, Jan. 4, 2001, vol. 409, pp. 66-69.

Chen, Robert J., "Noncovalent Sidewall Functionalization of Single-Walled Carbon Nanotubes for Protein Immobilization," J. Amer. Chem. Soc., 2001, vol. 123, pp. 3838-3839.

Puntes, Victor F., "Synthesis of hcp-Co Nanodisks," J. Amer. Chem. Soc., 2002, vol. 124, pp. 12874-12880.

An, Lei, "Synthesis of Nearly Uniform Single-Walled Carbon Nanotubes Using Identical Metal-Containing Molecular Nanoclusters as Catalysts," j. Amer. Chem. Soc., 2002, vol. (?), total of 4 pgs.

Cassell, Alan M., "Directed Growth of Free-Standing Single-Walled Carbon Nanotubes," American Chemical Society, Jun. 21, 1999, vol. 121, pp. 7975-7976.

Bahr, Jeffrey L., "Functionalization of Carbon Nanotubes by Electrochemical Reduction of Aryl Diazonium Salts: A Bucky Paper Electrode," American Chemical Society, 2001, vol. 123, pp. 6536-6542.

Fruchart, O., "Vertical self-organization of epitaxial magnetic nanostructures," Journal of Magnetism and Magnetic Materials, 2002, vol. 239, pp. 224-227.

Zhang, J., "Fabrication and photoluminescence of ordered GaN nanowire arrays," Journal of Chemical Physics, Oct. 1, 2001, vol. 115, pp. 5714-5717.

Dubois, S., "Fabrication and properties of arrays of superconducting nanowires," Journal of Materials Research Mar. 1999, vol. 14, pp. 665-671.

Liu, Z.Q., "Synthesis of $\alpha$-$SiO_2$ nanowires using Au nanoparticle catalysts of a silicon substrate," Journal of Materials Research, Mar. 2001, vol. 16, pp. 683-686.

Lei, Y, Fabrication, characterization, and photoluminescence properties of highly ordered $TiO_2$ nanowire arrays, J. Material Research, Apr. 2001, vol. 16, pp. 1138-1144.

Li, Y., "Fabrication of Highly ordered ZnO nanowire arrays in anodic alumina membranes," J. Materials Research, Nov. 2000, vol. 15, p. 2305-2308.

Sellmyer, D.J., "Magnetism of Fe, Co and Ni nanowires in self-assembled arrays," J. of Physics: Condensed Matter, (2000) vol. 13, pp. R433-R460.

Blick, R.H., "Nanostructural silicon for studying fundamental aspects of nanomechanics," J. of Physics: Condensed Matter, (2002), pp. R905-R945.

Ciraci, S., "Quantum effects in electrical and thermal transport through nanowires," J. of Physics: Condensed Matter, (2001), pp. R537-R568.

Yu, Jae-Young, "Silicon Nanowires: Preparation, Device, Fabrication, and Transport Properteis," J. Phys. Chem. B 2000, vol. 104, pp. 11864-11870.

Yu, Zhonghua, "(n, m) Structural Assignments and Chirality Dependence in Single-Wall Carbon Nanotube Raman Scattering," J. Phys. Chem. B 2001, vol. 105, pp. 6831-6837.

Wang, Y.W., "Fabrication of Ordered Ferromagnetic-Nonmagnetic Alloy Nanowire Arrays and their Magnetic Property Dependence on Annealing Temperature," J. Phys. Chem. B 2002, vol. 106, pp. 2502-2507.

Murphy, Robert, "High-Yield, Nondestructive Purification and Quantification Method for Multiwalled Carbon Nanotubes," J. Phys. Chem. B 2002, vol. 106, pp. 3087-3091.

Li, C.P., "Silicon Nanowires Wrapped with Au Film," J. Phys. Chem. B 2002, vol. 106, pp. 6980-6984.

Steuerman, David W., "Interactions between Conjugated Polymers and Single-Walled Carbon Nanotubes," J. Phys. Chem. B 2002, vol. 106, pp. 3124-3130.

Li, Jun, "Novel Three-Dimensional Electrodes: Electrochemical Properties of Carbon Nanotube Ensembles," J. Phys. Chem. B 2002, pp. A-G.

Cassell, Alan M., "Large Scale CVD Synthesis of Single-Walled Carbor Nanotubes," J. Phys. Chem. B 1999, vol. 103, pp. 6484-6492.

Dai, Hongju, "Controlled Chemical Routes to Nanotube Architectures, Physics, and Devices," J. Phys. Chem. B 1999, vol. 103, pp. 11246-11255.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Tulchinsky, D.A., "Fabrication and domain imaging of iron magnetic nanowire arrays," J. Vac. Sci. Technol., May/Jun. 1998, A 16(3), pp. 1817-1819.

Yun, Wan Soo, "Fabrication of metal nanowire using carbon nanotube as a mask," J. Vac. Sci. Technol., Jul./Aug. 2000, A 18(4), pp. 1329-1332.

Batra, Inder P., "Quantum transport through one-dimensional aluminum wires," J. Vac. Sci. Technol., May/Jun. 2002, B 20(3), pp. 812-817.
Tsutsumi, Toshiyuki, "Fabrication technology of ultrafine $SiO_2$ masks and Si nanowires using oxidation of vertical sidewalls of a poly-Si layer," J. Vac. Sci. Technol., Jan./Feb. 1999, B 17(1), pp. 77-81.
Namatsu, Hideo, "Fabrication of one-dimensional nanowire structures utilizing crystallographic orientation in silicon and their conductance characteristics," J. Vac. Sci. Technol., Sep./Oct. 1997, B 15(5), pp. 1688-1696.
Namatsu, Hideo, "Fabrication of thickness-controlled silicon nanowires and their characteristics," J. Vac. Sci. Technol., Nov./Dec. 1995, B 13(6), pp. 2166-2169.
Cassell, Alan M., "Combinatorial Optimization of Heterogeneous Catalysts Used in the Growth of Carbon Nanotubes," Langmuir 2001, vol. 17, pp. 260-264.
Lewenstein, Justin C. High-Yield Selective Placement of Carbon Nanotubes on Pre-Patterned Electrodes, Nano Letters., 2002, vol. 2, No. 5, pp. 443-446.
Martino, Anthony, "Catalyst Testing of Highly Dispersed Metal Nanoparticles for Coal Liquefaction and Coal/Waste Copressing," Catalysis and Chemical Technologies Department, Sandia National Laboratories, pp. 1-7.
Peng, X.S., "Electrochemical fabrication of ordered $Ag_2S$ nanowire arrays," Materials Research Bulletin, 2002, No. 37, pp. 1369-1375.
Robinson, L.A. W., "Self-aligned electrodes for suspended carbon nanotube structures," Microelectronics Research Centre, Cavendish Laboratory, University of Cambridge and Hitachi Cambridge Laboratory, pp. 1-2.
Moore, Gordon E., "Cramming more components into integrated circuits," Electronics, Apr. 19, 1965, vol. 38, No. 8(4), 4 pgs.
Fan, Hongyou, "Multiphased assembly of nanoporous silica particles," Journal of Non-Crystalline Solids (2001) vol. 285, pp. 71-78.
Franklin, Nathan R., "Integration of suspended carbon nanotube arrays into electronic devices and electromechanical systems," Applied Physics Letters, Jul. 29, 2002, vol. 81, No. 5, 913-915.
Kong, Jing, "Synthesis of individual single-walled carbon nanotubes on patterned silicon wafers," Nature, Oct. 29, 1998, vol. 395, pp. 878-881.
Duan, Xiangfeng, "Nonvolatile Memory and Programmable Logic from Molecule-Gated Nanowires," Nano Letters, 2002, pp. A-D.
Fuhrer, M.S., "High-Mobility Nanotube Transistor Memory," Nano Letters, 2002, vol. 2, No. 7, pp. 755-759.
Radosavljević, M., "Nonvolatile Molecular Memory Elements Based on Ambipolar Nanotube Field Effect Transitors," Nano Letters, 2002, vol. 2, pp. 761-764.
Derycke, V., "Catalyst-Free Growth of Ordered Single-Walled Carbon Nanotube Networks," Nano Letters, 2002, pp. A-D.
Joselevich, Ernesto, "Vectorial Growth of Metallic and Semiconducting Single-Wall Carbon Nanotubes," Nano Letters, xxxx, vol. 0, pp. A-E.
Javey, Ali, "Carbon Nanotube Transistor Arrays for Multistage Complementary Logic and Ring Oscillators," Nano Letters, 2002, pp. A-D.
Robertson, John, "Section 11. Non-Crystalline Carbon, Properties and Prospects for Non-Crystalline Carbons," Journal of Non-Crystalline Solids 299-302, 2002, pp. 798-804.
Ci, Lijie, "Double Wall Carbon Nanotubes Promoted by Sulfur in a Floating Iron Catalyst CVD System," Chemical Physics Letters 359, Jun. 13, 2002, pp. 63-67.
Gromov, A., "Purification of Carbon Nanotubes," Caramel Workshop, Jan. 23, 2002, pp. 1-13.
Cui, Yi, "Functional Nanoscale Electronic Devices Assembled Using Silicon Nanowire Building Blocks," Science, Feb. 2, 2001, vol. 291, pp. 851-853.
Wang, Suhua, Thermal Oxidation of $Cu_2S$ Nanowires: a Template Method for the Fabrication of Mesoscopic $Cu_xO$ (x=1,2) Wires, Phys. Chem. Chem. Phys., 2002, vol. 4, pp. 3425-3429.
Untiedt, C., "Fabrication and Characterization of Metallic Nanowires," Physical Review B, Jul. 15, 1997, vol. 56, No. 4, pp. 2154-2160.

Marsen, Bjorn, "Fullerene-Structured Nanowires of Silicon," Physical Review B, Oct. 15, 1999, vol. 60, No. 16, pp. 11593-11600.
Berber, Savas, "Unusually High Thermal Conductivity of Carbon Nanotubes," Physical Review Letters, May 15, 2000, vol. 84, No. 20, pp. 4613-4616.
Yao, Zhen, "High-Field Electrical Transport in a Single-Wall Carbon Nanotubes," Physical Review Letters, Mar. 27, 2000, vol. 84, No. 13, pp. 2641-2944.
Zhang, Y.F., "Liquid Phase Synethesis of Carbon Nanotubes," Physica B 323, 2002, pp. 293-295.
Dresselhaus, M.S., "Raman Spectroscopy on One Isolated Carbon Nanotube," Physica B 323, 2002, pp. 15-20.
Fu, Qiang, "Electrodeposition of Carbon Films from Various Organic Liquids," Surface & Coatings Technology 124, 2000, pp. 196-200.
Hernadi, K., "Reactivity of Different Kinds of Carbon During Oxidative Purification of Catalytically Prepared Carbon Nanotubes,", Solid State Ionics 141-142, 2001, pp. 203-209.
Colomer, J. F., "Different Purification Methods of Carbon Nanotubes Produced by Catalytic Synthesis," Synthetic Metals 103, 1999, pp. 2482-2483.
Dalton, A.B., "A Functional Conjugated Polymer to Process, Purify and Selectively Interact with Single Wall Carbon Nanotubes," Synthetic Metals 121, 2001, pp. 1217-1218.
Tat, Kerk Wai, "Preparation and Characterization of Cobalt/Silica Core-Shell Magnetic Nanoparticles," Dept. Chem., National University of Singapore 2000/2001, pp. 1-5.
Shipley, Microposit® XP-90104A E-Beam Resist, Preliminary Product Information, pp. 1-2.
Smalley, R. E., Foreword (Publication unknown), Jan. 2001.
Dresselhaus, Mildred S., Preface (Publication unknown) Jan. 2001.
Advanced Semiconductor Engineering, Inc., Substrate Design 420L BGA 35*35, Dwg. No. K-I-0420, 2 pages.
Integrated Device Technology, Inc., DA Package Design, Sep. 25, 1997, 2 pages.
Integrated Device Technology, Inc. BG Package Outline, Feb. 18, 1994.
Pimenta, M.A., "Diameter dependence of the Raman D-band in isolated single-wall carbon nanotubes," Physical Review B, vol. 64 pp. 04140-1-04140-4.
Duan, Xiangfeng, Nonvolatile Memory and Programmable Logic from Molecule-Gated Nanowires, Nano Letters, Mar. 2002, pp. 1-4.
Introduction and Historical Perspective, Chapter 1, pp. 1-48.
Modern CMOS Technology, Chapter 2, pp. 49-92.
Crystal Growth, Wafer Fabrication and Basic Properties of Silicon Wafers, Chapter 3, pp. 93-149.
Kong, J., et al., "Chemical Vapor Disposition of Methane for Single-Walled Carbon Nanotubes." Chemical Physics Letters, 292, 567, 1998.
Li., Y., et al., "Growth of Single-Walled Carbon Nanotubes from Discrete Catalytic Nanoparticles of Various Sizes." *The Journal of Physical Chemistry B* (2001); 105, 11424.
Colomer, J.-F., at al., "Characterization of Single-Walled Carbon Nanotubes Produced by CCVD Method." *Chemical Physics Letters* (2001); 345, 11-17.
Li, Y. et al., "Preparation of Monodispersed Fe-Mo Nanoparticles as the Catalyst for CVD Synthesis of Carbon Nanotubes." Chem. Mater., 12. 1008, 2001.
Cassell, A., et al., "Large Scale Synthesis of Single-Walled Carbon Nanotubes." *The Journal of Physical Chemistry B* (1999); vol. 103, No. 22: 6484-6492.
Cassell, A., et al., "Directed Growth of Free-Standing Single-Walled Carbon Nanotubes." *Journal of the American Chemical Society* (1999); vol. 121, 7975-7976.
Delzeit, L., et al., "Multilayered Metal Catalysts for Controlling the Density of Single-walled Carbon Nanotube Growth." Chemical Physics Letters, 348, 368, 2001.
Wei, Y., et al., "Effect of Catalyst Film Thickness on Carbon Nanotube Growth by Selective Area Chemical Vapor Deposition." *Applied Physics Letters* (2001); vol. 78, pp. 1394-1396.
Su., M., et al., "A Scalable CVD Method for the Synthesis of Single-Walled Carbon Nanotubes with High Catalyst Productivity." *Chemical Physics Letters* (2000); vol. 322, 231-326.

Harutyunyan, A., et al., "CVD Synthesis of Single Wall Carbon Nanotubes under 'Soft' Conditions." *Nano Letters* vol. 2c No. 5 525 (2002); Published on web Mar. 27, 2002.

Li, Q., et al., "High-Density Growth of Single-Wall Carbon Nanotubes on Silicon by Fabrication of Nanosized Catalyst Thin Films." *Chem. Mater.* (2002), 14, 4262; Published on web Sep. 11, 2002.

Homma, Y., et al., "Growth of Suspended Carbon Nanotube Networks on 100nm-Scale Silicon Pillars." *Applied Physics Letters.* (2002); vol. 81 No. 12, 2261-2263.

Javey, A., et al., "Carbon Nanotube Transistor Arrays for Multistage Complementary Logic and Ring Oscillators." *Nano Letters* (2002); vol. 2 No. 9 929-932. Published on web Jul. 31, 2002.

Kong, J., et al., "Syntheses of Individual Single-Walled carbon Nanotubes on Patterned Wafers." *Nature* (1998); 395: 878-881.

Chen, B., et al., "Heterogeneous Single-Walled Carbon Nanotube Catalyst Discovery and Optimization." *Chem. Mater.* (2002); vol. 14 1891-1896.

Yenilmez, E., et al., "Wafer Scale Production of carbon Nanotube Scanning Probe Tips for Atomic Force Microscopy." *Applied Physics Letters.* (2002); vol. 80 No. 12, 2225-2227.

Peigney, A., et al., "A Study of the Formation of Single-and-Double-Walled carbon Nanotubes by a CVD Method." *The Journal of Physical Chemistry B* (2001); 105: 9699-9710.

Franklin, N., et al., "Integration of Suspended Carbon Nanotube Arrays into Electronic Devices and Electroechanical Systems." *Applied Physics Letters* (2002); vol. 81 No. 5, 913-905.

Collins, P., et al., "Engineering Carbon Nanotubes and Nanotube Circuits Using Electrical Breakdown." Science (2001); 292: 706-709.

Kim, W., et al., "Synthesis of Ultralong and High Percentage of Semiconduction Single-walled Carbon Nanotubes." *Nano Letters* (2002); vol. 2 No. 7 703-708. Published on web Jun. 1, 2002.

Reuckes, T., et al., "Carbon Nanotube-Based Nonvolatile Random Access Memory for Molecular Computing." *Science*, vol. 289, 94-97, Jul. 7, 2000.

Liu, et al., "Organizing Single-Walled Carbon Nanotubes on Gold Using a Wet Chemical Self-Assembling Technique, Langmuir," Apr. 18, 2000, vol. 16, No. 8, 3659-3573.

Soh, et al., "Integrated Nanotube Circuits: controlled growth and ohmic contacting of single-walled carbon nanotubes", Applied Physics Letters, Aug. 2, 1999, vol. 75, No. 5, 627-629.

Zheng et al, "Chemical Vapor Deposition Growth of Well-Aligned Carbon Nanotube Patterns on Cubic Mesoporous Silica Films by Soft Lithography", Chemistry of Materials, Jun. 9, 2001, vol. 13, 2240-2242.

Huang, et al., "Patterned Growth of Well-Aligned Carbon Nanotubes: A Soft-Lithographic Approach", The Journal of Physical Chemistry B., Mar. 16, 2000, vol. 104, No. 10, 2193-2196.

Chattopadhyay, et al., "Metal-Assisted Organization of Shortened Carbon Nanotubes in Monolayer and Mulilayer Forest Assemblies", Journal of the American Chemical Society, Aug. 28, 2001, vol. 123, 9451-9452.

Bonard, J. et al., "Monodisperse Multiwall Carbon Nanotubes Obtained with Ferritin as Catalyst", Nano Letters, 2002, vol. 2, No. 6, 665-667.

Collins, P., "Engineering Carbon Nanotubes and Nanotube Circuits Using Electrical Breakdown", Science, vol. 292, Apr. 27, 2001, pp. 706-709.

Homma, Y., "Single-Walled Carbon Nanotube Growth on Silicon Substrates Using Nanoparticle Catalysts", Jpn. J. Appl. Phys., vol. 41 (2002), pp. L89-L91.

Snow, E.S. et al., "Random Networks of Carbon Nanotubes as an Electronic Material." Applied Physics Letters, Mar. 31, 2003, vol. 82, No. 13, 2145-2147.

Bernholc et al., "Mechanical and Electrical Properties of Nanotubes", Annu. Rev. Mater. Res., 32 (2002) 347.

Ramsperger, U., "Fabrication and lateral electronic transport measurements of gold nanowires," Applied Physics Letters, Jan. 1, 2001, vol. 78, pp. 85-87.

Legrand, B., "Silicon nanowires with sub 10 nm lateral dimensions: From atomic force microscope lithography based fabrication to electrical measurements," J. Vac. Sci. Technol., May/Jun. 2002, B 20(3), PGS.862-870.

524

600

606

612

614

618

524

700

706

524

704  704 702

700

802

← 804

524

1300

1304

1310

900

912

524

1400

1404

524

508 →
1304

1310

900

912

524

1404

902   902   902

1310

900

912

524

1702
1802
1800

518

908   908   908

1804

ELECTROMECHANICAL THREE-TRACE JUNCTION DEVICES

CROSS REFERENCE TO RELATED APPLICATIONS

This application is a continuation-in-part of U.S. application Ser. No. 10/033,323, entitled "Electromechanical Three-Trace Junction Devices," filed Dec. 28, 2001, now U.S. Pat. No. 6,911,682 and to which this application claims priority under 35 USC § 120. It is related to the following patent applications, all of which are incorporated by reference in their entirety: U.S. application Ser. No. 09/915,093, entitled "Electromechanical Memory Array Using Nanotube Ribbons and Method for Making Same," filed Jul. 25, 2001; U.S. application Ser. No. 09/915,173 entitled "Electromechanical Memory Having Cell Selection Circuitry Constructed with Nanotube Technology," filed Jul. 25, 2001; and U.S. application Ser. No. 09/915,095 entitled "Hybrid Circuit Having Nanotube Electromechanical Memory," filed Jul. 25, 2001.

BACKGROUND

1. Technical Field

This invention relates in general to nonvolatile switching devices and, in particular, to nonvolatile memory arrays that use electromechanical nanotube technology.

2. Discussion of Related Art

Typical memory devices involve single-bit memory cells that have either an "on" state or an "off" state. One bit of memory storage is determined by either the "on" or "off" condition. The number of bits is dependent directly upon the number of memory cells in a particular memory array. For example, a device, which stores n bits, must have n memory cells. In order to increase the number of memory cells either the overall size of the memory array must increase or the size of each memory element must decrease. Increases in memory cell density have been achieved by improving lithographic techniques that have allowed progress from the production of micron-sized elements to the delineation of nanometer-sized features.

Important characteristics for a memory cell in an electronic device are low cost, high density, low power, high speed, and nonvolatility. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM), and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long (millisecond) write cycles and low relative speed in comparison to DRAM or SRAM. Flash also has a finite number of read/write cycles leading to low long-term reliability. ROM, PROM, EPROM, and EEPROM are all nonvolatile, meaning that if power to the memory is interrupted the memory will retain the information stored in the memory cells.

DRAM stores charges on transistor gates that act as capacitors, but its need to be electrically refreshed every few milliseconds complicates system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

As the discussion above indicates, conventional memory solutions fail to possess all the desired characteristics. Existing technologies that are nonvolatile are not randomly accessible and have low density, high cost, and limited ability to allow multiple writes with high reliability of circuit function. Meanwhile, existing technologies that are volatile complicate system design or have low density. Some emerging technologies have attempted to address these shortcomings.

For example, magnetic RAM (MRAM) or ferromagnetic RAM (FRAM) utilizes the orientation of magnetization or a ferroelectric region to generate a nonvolatile memory cell. To obtain nonvolatility, MRAM utilizes magnetoresistive memory elements involving the anisotropic magnetoresistance or giant magnetoresistance of magnetic multilayer structures. However, both of these types of memory cells have relatively high resistance and low density. A different MRAM memory cell based upon magnetic tunnel junctions has also been examined but has not led to large-scale commercialized devices.

FRAM uses a similar circuit architecture but stores information not in magnetic cells but in thin-film ferroelectric devices. These devices are purported to yield a nonvolatile memory by retaining their electrical polarization after an externally applied electric switching field is removed. However, FRAM suffers from a large memory cell size, and material incompatibility with standard semiconductor CMOS fabrication processes that make it difficult to manufacture large-scale integrated components. See U.S. Pat. Nos. 4,853,893; 4,888,630; 5,198,994.

Another technology having nonvolatile memory is phase change memory. This technology stores information via a structural phase change in thin-film alloys incorporating elements such as selenium or tellurium. These alloys are purported to remain stable in both crystalline and amorphous states, and the fact that these states are electrically distinct allows the formation of bistable switches. Nonetheless, while the nonvolatility condition is met, this technology appears to suffer from slow operations, difficulty of manufacture and reliability problems, and has not reached a state of commercialization. See U.S. Pat. Nos. 3,448,302; 4,845,533; 4,876,667; 6,044,008.

Wire crossbar memory (MWCM) has also been proposed. See U.S. Pat. Nos. 6,128,214; 6,159,620; 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain nonvolatility owing to the inherent instability found in redox processes.

Recently, memory devices have been proposed which use nanoscopic wires, such as single-walled carbon nanotubes, to form crossbar junctions to serve as memory cells. See WO 01/03208 ("Nanoscopic Wire-Based Devices, Arrays, and Methods of Their Manufacture"), and Thomas Rueckes et al., "Carbon Nanotube-Based Nonvolatile Random Access Memory for Molecular Computing," Science, vol. 289, pp. 94–97 (2000). Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectifying junction. When electrical power is removed from the junction, the wires retain their physical (and thus electrical) state thereby forming a nonvolatile memory cell.

The NTWCM proposals to date rely on directed growth or chemical self-assembly techniques to grow the individual nanotubes needed for the memory cells. These techniques are now believed to be difficult to employ at commercial scales using modem technology. Moreover, they may contain inherent limitations such as the length of the nanotubes that may be grown reliably using these techniques, and it may be difficult to control the statistical variance of geometries of nanotube wires so grown.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. patent application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. patent application Publication No. 2003-0124325, three-trace architectures may be used for electromechanical memory cells, in which the two of the traces are electrodes to control the deflection of the ribbon.

SUMMARY

The invention provides three-trace electromechanical circuits and methods of using same.

According to one aspect of the invention, a circuit includes first and second electrically conductive elements with a nanotube ribbon disposed therebetween. The nanotube ribbon is movable toward at least one of the first and second electrically conductive elements in response to electrical stimulus applied to at least one of the first and second electrically conductive elements and the nanotube ribbon. One of the two electrically conductive elements has an insulative coating or layer on a surface facing the nanotube ribbon.

According to one aspect of the invention, the coating on the electrode is an oxide.

Under yet another aspect of the invention, an array is defined by a plurality of nanotube ribbon-based elements as described above.

According to another aspect of the invention, a circuit array includes a lower structure having a plurality of lower electrically conductive elements and a plurality of lower support structures, and an upper structure having a plurality of upper electrically conductive elements, one conductive element of each three-trace junction having an insulative coating, and a plurality of upper support structures. A plurality of nanotube ribbons is disposed between the lower and upper structures and in contact with the lower support structures and the upper support structures. Each nanotube ribbon has a longitudinal orientation that crosses the longitudinal orientation of the plurality of lower and upper electrically conductive elements. Each location where a nanotube ribbon crosses an electrically conductive element defines a circuit cell, and a nanotube ribbon is movable within a circuit cell in response to electrical stimulus applied to at least one of the electrically conductive elements (coated or uncoated) and the nanotube ribbons. Electrical signals from the electrically conductive element and the nanotube ribbon may be sensed to determine the electrical state of the cell.

According to other aspects of the invention, the nanotube ribbon element of a circuit or circuit array may be replaced with other forms of electromechanical elements, including nanotubes.

According to another aspect of the invention, a circuit cell having a first electrically conductive element, a second electrically conductive element, and a nanotube ribbon disposed between the first and second electrically conductive elements may be electrically simulated in a variety of ways. An electrical stimulus may be applied to at least one of the first and second electrically conductive elements and the nanotube ribbon to move the nanotube ribbon toward at least one of the first and second electrically conductive elements. Electrical signals from at least one the first and second electrically conductive elements and the nanotube ribbon may be sensed to determine the electrical state of the cell.

Under another aspect of the invention, electrical stimulus is applied to both the first and second electrically conductive elements so that the first and second electrically conductive elements both cause the movement of the nanotube ribbon; Under another aspect of the invention one of the traces is used to move the nanotube ribbon into contact with a conductive trace and another trace is used to create a force to pull the nanotube ribbon from (or release it from) such contact.

BRIEF DESCRIPTION OF THE DRAWINGS

In the accompanying drawings.

DETAILED DESCRIPTION

Figure 1:
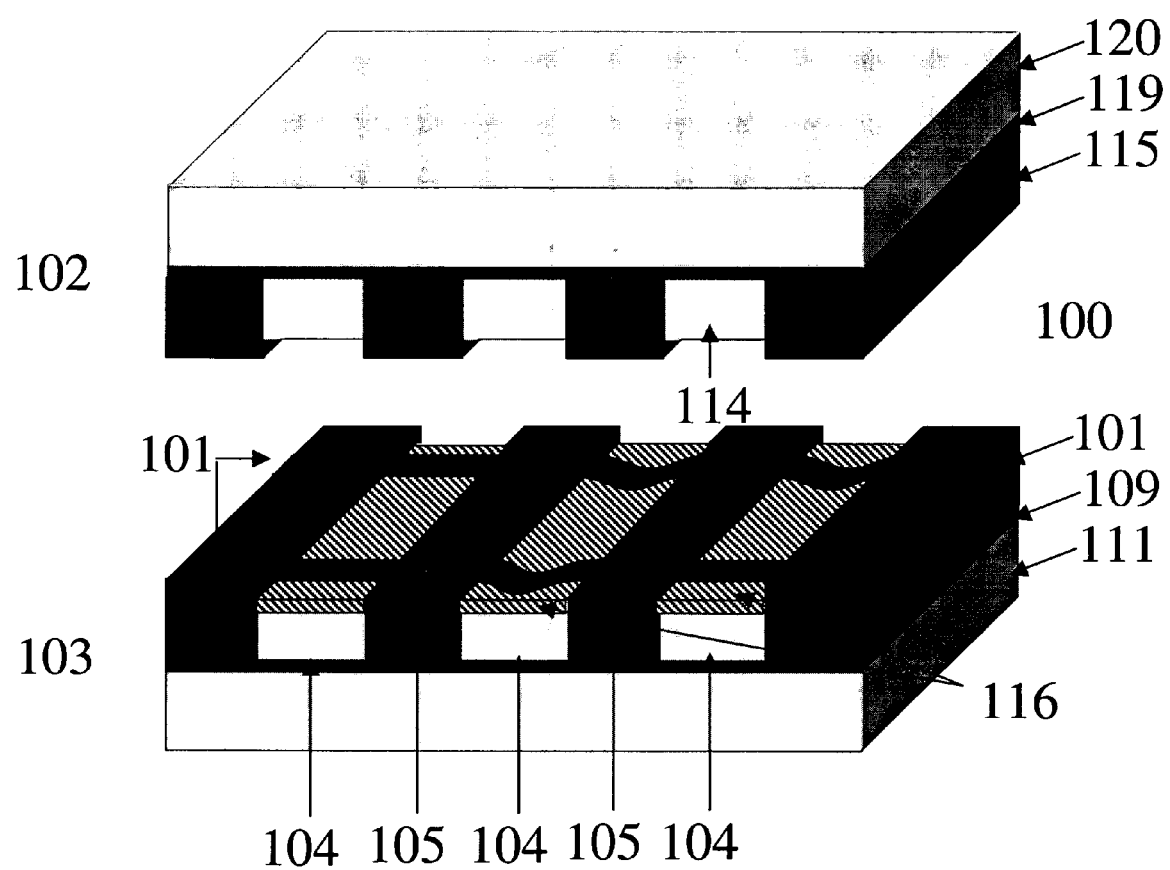
FIG. 1 illustrates a nanotube belt crossbar memory device according to certain embodiments of the invention.

Preferred embodiments of the invention provide new electromechanical circuit elements and methods of making the same. In particular, three-trace devices are shown and methods of making same are described. As will be explained below, the use of three traces (1) increases power efficiency by storing non-volatile memory state, and (2) improves reliability and speed of switching a given element or cell. Moreover, certain embodiments effectively enclose the three-trace junctions, facilitating their use, fabrication, and distribution, especially in the case of hybrid circuits.

In short, preferred embodiments of the present invention include electromechanical circuit junctions formed from at least three crossing traces, only one of which needs to be an electromechanically responsive trace. Though the electromechanically responsive trace may be formed from a carbon nanotube, nanotube rope, or a belt or wire made of another appropriate material, certain preferred embodiments form such a trace as a nanotube ribbon disposed between the other two traces. (The term "trace" is not intended to be limiting to any particular geometry or fabrication technique and instead is intended to broadly cover an electrically conductive path.)

The three-trace device may be used to improve the reliability and speed of switching a given element. For example, by positioning an electromechanically responsive trace between two other traces, the two other traces may be stimulated to act in concert upon the electromechanically responsive trace. One trace may be stimulated to repulse the electromechanically responsive trace, and the other may be stimulated to attract the electromechanically responsive trace.

Certain preferred embodiments use nanotube ribbons to implement electromechanically responsive traces. Consequently, these embodiments constitute a new set of nanotube ribbon crossbar memory (NTRCM) devices. NTRCM versions of the invention enjoy the same advantages over nanotube wire crossbar memory (NTWCM) versions that NTRCM two-trace junction devices enjoyed over their NTWCM counterparts. See U.S. application Ser. No. 09/915,093, entitled "Electromechanical Memory Array Using Nanotube Ribbons and Method for Making Same"; U.S. application Ser. No. 09/915,173 entitled "Electromechanical Memory Having Cell Selection Circuitry Constructed with Nanotube Technology;" and U.S. application Ser. No. 09/915,095, entitled "Hybrid Circuit Having Nanotube Electromechanical Memory," all of which are incorporated by reference in their entirety. The preferred embodiments may use the techniques discussed in the above cases to create the nanotube ribbons, or they may use the techniques disclosed in U.S. application Ser. Nos. 10/128,118, 10/774,682, and 10/776,573, entitled "Nanotube Films and Articles;" U.S. application Ser. No. 10/128,117, entitled "Methods of Nanotube Films and Articles;" U.S. application Ser. No. 10/341,005, entitled "Methods of Making Carbon Nanotube Films, Layers, Fabrics, Ribbons, Elements and Articles;" U.S. application Ser. No. 10/341,055, entitled "Methods of Using Thin Metal Layers to Make Carbon Nanotube Films, Layers, Fabrics, Ribbons, Elements and Articles;" U.S. application Ser. No. 10/341,054, entitled "Methods of Using Pre-Formed Nanotubes to Make Carbon Nanotube Films, Layers, Fabrics, Ribbons, Elements and Articles;" and U.S. application Ser. No. 10/341,130, entitled "Carbon Nanotube Films, Layers, Fabrics, Ribbons, Elements and Articles," all of which are hereby incorporated by reference in their entirety. The belt structures of NTRCM devices are believed to be easier to build at the desired levels of integration and scale (in number of devices made), and their geometries are more easily controlled. Furthermore, large-scale integration of these nanotube ribbons is straightforward in a way that allows for a large degree of redundancy in architecture, and thus increased reliability.

FIG. 1 illustrates an exemplary electromechanical memory array 100 in exploded view. In this embodiment, the array contains nanofabric ribbons 101 between an upper structure 102 and a lower structure 103.

The lower structure 103 includes a plurality of generally parallel electrically conductive traces 104, disposed between generally parallel and upwardly-protruding supports 105. The traces 104 and supports 105 are generally perpendicular to the ribbons 101. The traces and supports are arranged over a gate oxide layer 109 and silicon substrate 111. Under certain embodiments, traces 104 are coated with an insulative material 116. Such insulative material 116 may be a coating of oxide created by oxidizing the traces 104, or the insulative material may be any appropriate material placed upon traces 104 by any appropriate means. The location of the insulative material, either on the surface of the top or the bottom conductive elements is immaterial to the operation of the invention; either location will work, but for the sake of simplicity and clarity, bottom conductive traces 104 are shown with an insulative coating 116.

The upper structure 102 is similar to the lower structure. The upper structure 102 includes a plurality of generally parallel electrically conductive traces 114, disposed between generally parallel and downwardly-protruding supports 115. The traces 114 and supports 115 are generally perpendicular to the ribbons 101. The traces and supports are arranged under a gate oxide layer 119 and silicon substrate 120.

For both the upper and lower structures 102, 103, the electromechanically responsive elements 101 are nanotube ribbons. However, other materials, including nanotubes, may be used. Under certain preferred embodiments, a nanotube ribbon 101 has a width of about 180 nm and is pinned to insulating supports 102 (more below).

For both the upper and lower structures 102, 103, the traces 104, 114 may be made of any suitable electrically conductive material and may be arranged in any of a variety of suitable geometries. One trace 104 or 114 may be coated with an insulative material. In the example of FIG. 1, lower trace 104 is shown with such an insulative coating for simplicity (i.e., the upper trace could have such coating). Certain preferred embodiments utilize n-doped silicon to form such traces, preferably no wider than the nanotube belt 101, e.g., about 180 nm.

For both the upper and lower structures 102, 103, the supports 102 and 112, likewise, may be made of a variety of materials and geometries, but certain preferred embodiments utilize insulating material, such as spin-on-glass (SOG). The preferred thickness (height) must equal or exceed the height of the electrodes preferably from 100 nm to 1 micron.

As will be explained below, under certain embodiments, the ribbons 101 are shown held between the contacting supports by friction. Many alternative clamping and pinning structures and methods are possible, but are not explained here for the sake of brevity. See, for example, U.S. Provisional Pat. application, Ser. No. 60/446,786, filed on Feb. 12, 2003, and U.S. patent application Ser. No. 10/776,572, filed on Feb. 11, 2004, both of which are entitled Electro-Mechanical Switches and Memory Cells Using Vertically-Disposed Nanofabric Articles and Methods of Making the Same; and U.S. Pat. application, No. 60/446,783, filed on Feb. 12, 2003, and U.S. Pat. application Ser. No. 10/776,059, filed on Feb. 11, 2004, both of which are entitled Electro-Mechanical Switches and Memory Cells Using Horizontally-Disposed Nanofabric Articles and Methods of Making the Same, all of which are incorporated herein by reference in their entirety.

In other embodiments, the ribbon may be held by other means, such as by anchoring the ribbons to the supports using any of a variety of techniques. The nanotube ribbons 101 are also pinned to the upper surfaces of lower supports 102 by the upper supports being deposited on top of the lower supports. Evaporated or spin-coated material such as metals, semiconductors or insulators—especially silicon, titanium, silicon oxide or polyimide—may be used to increase the pinning strength. The friction interaction can be increased through the use of chemical interactions, including covalent bonding through the use of carbon compounds such as pyrenes or other chemically reactive species. See R. J. Chen et al., "Noncovalent Sidewall Functionalization of Single-Walled Carbon Nanotubes for Protein Immobilization," J. Am. Chem. Soc., vol. 123, pp. 3838–39 (2001), and Dai et al., Appl. Phys. Lett., vol. 77, pp. 3015–17 (2000), for exemplary techniques for pinning and coating nanotubes by metals. See also WO 01/03208 for techniques.

Each instance where a ribbon crosses corresponding, oppositely-disposed traces defines a memory or logic cell. The actual number of such cells is immaterial to understanding the invention, but the technology may support devices having high integration and scale.

Figure 2:
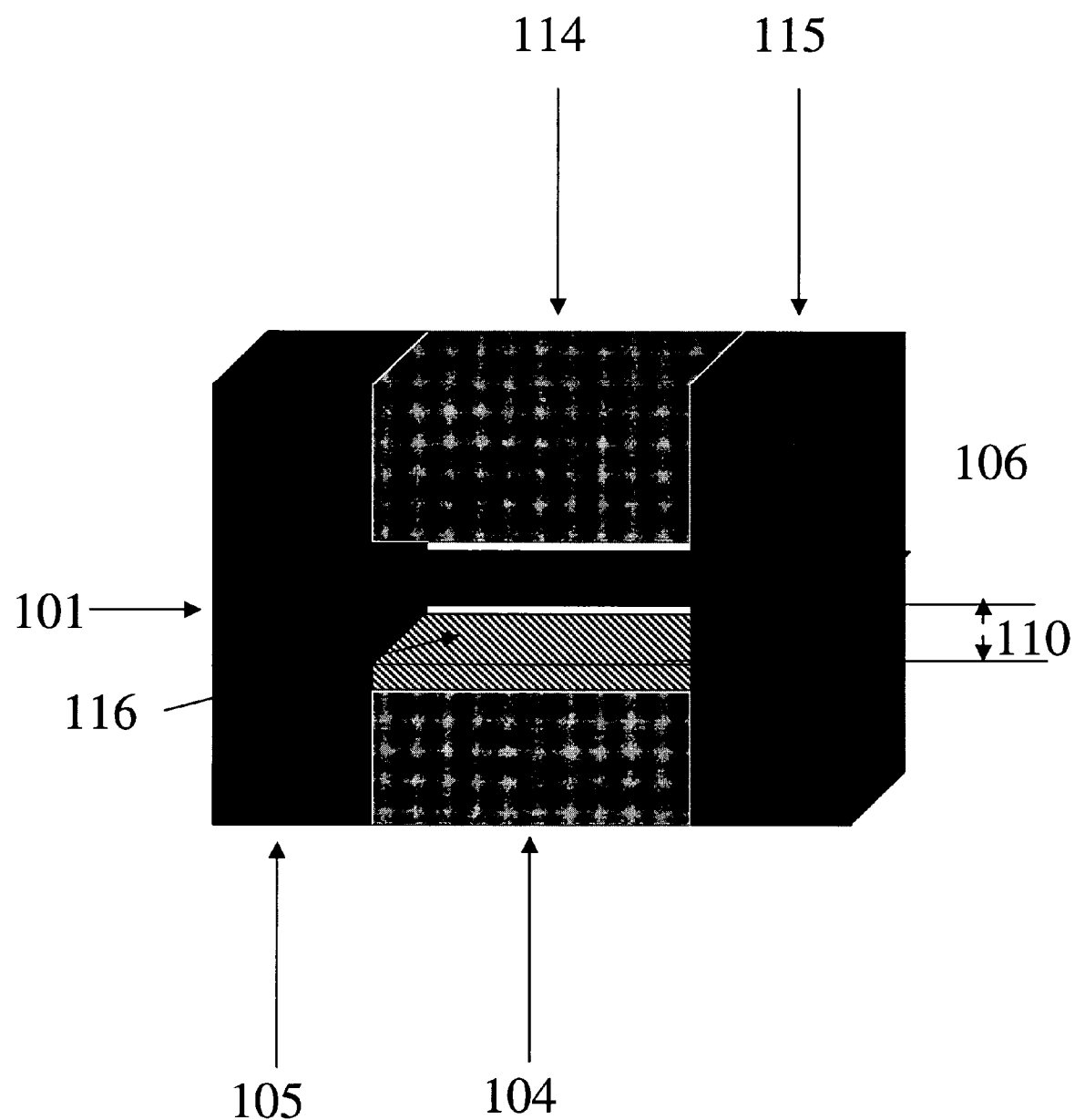
FIGS. 2–4B illustrate different states of a memory cell according to certain embodiments of the invention.
Figure 3:
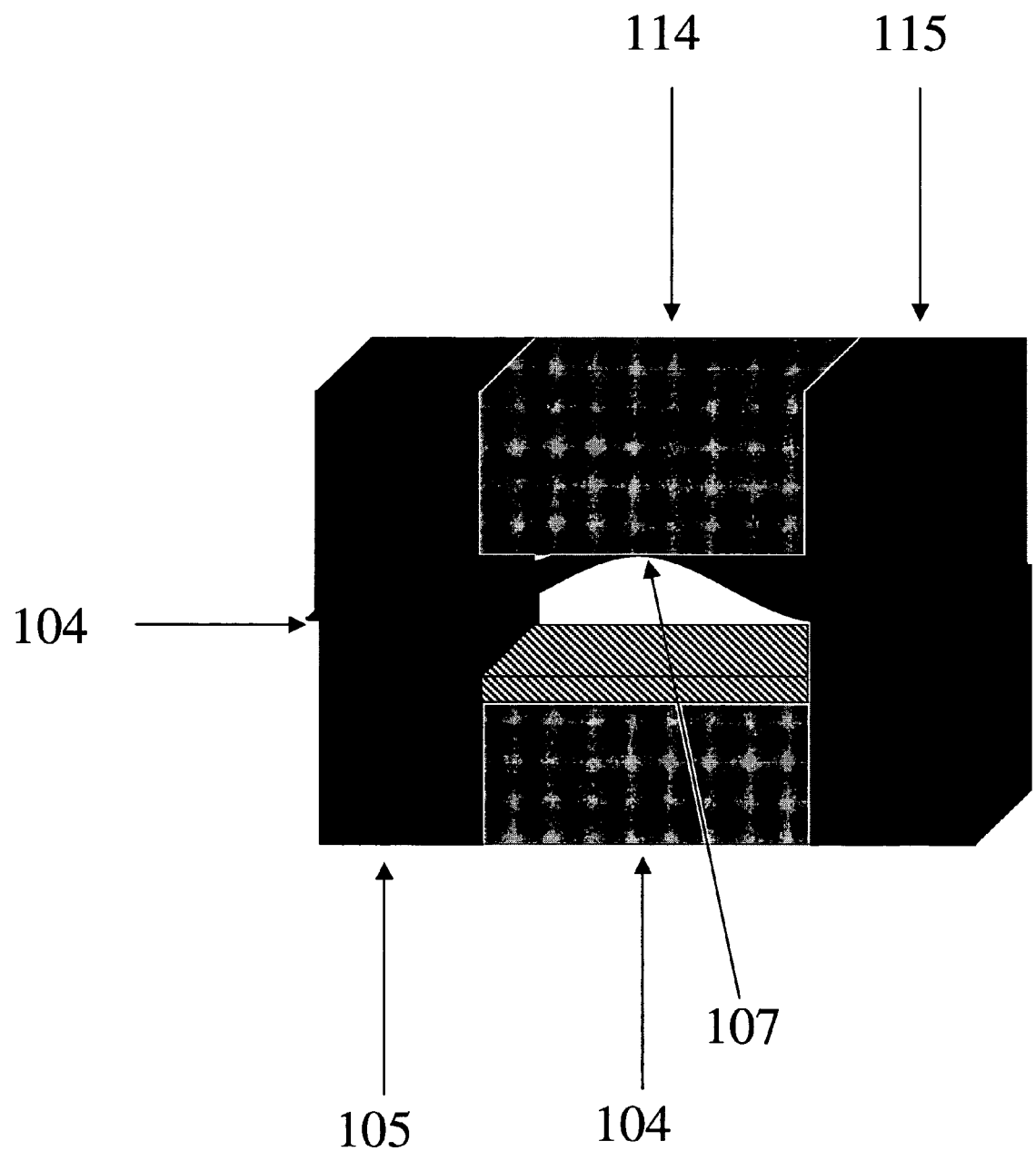
Figure 4A:
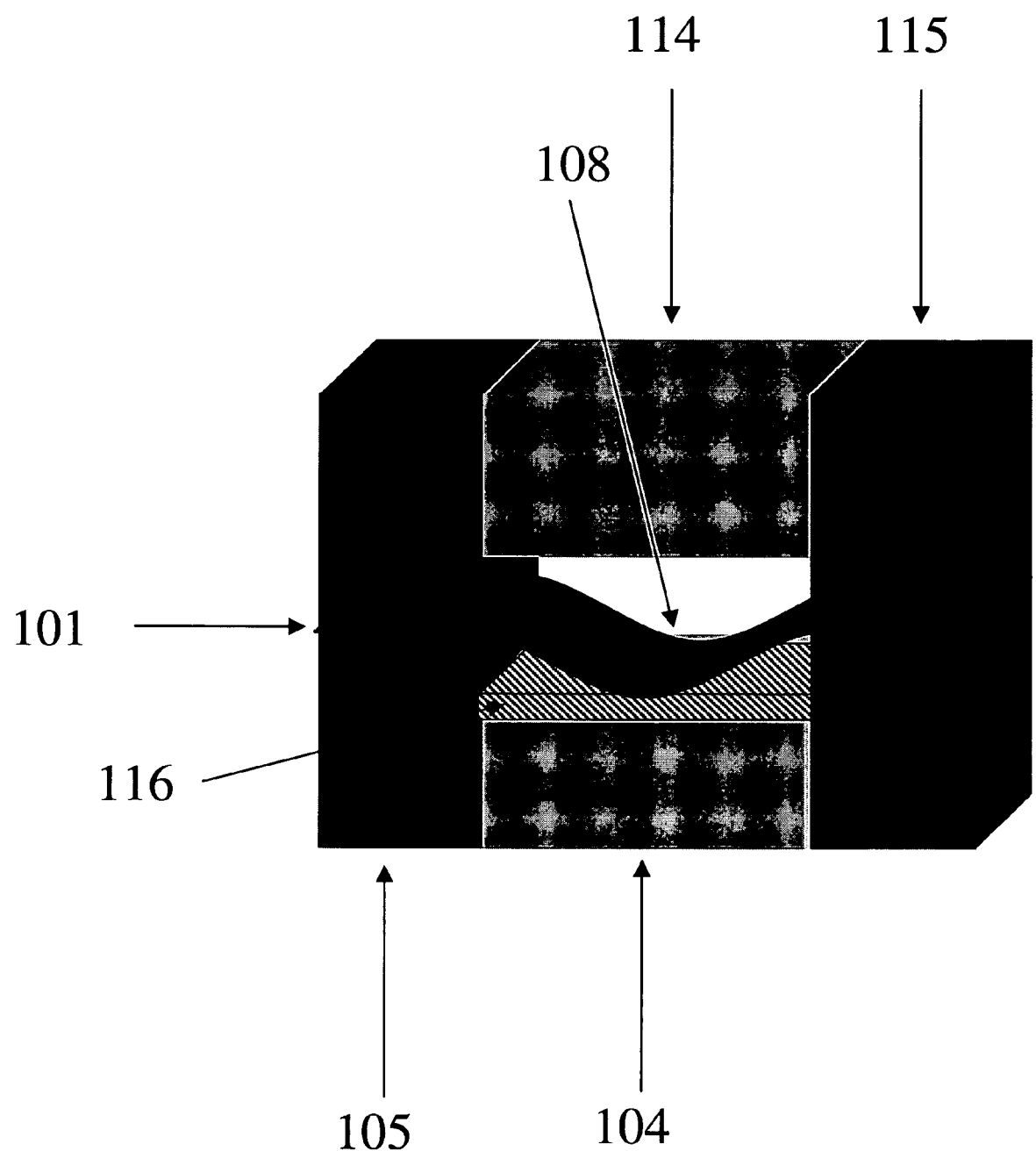
Figure 4B:
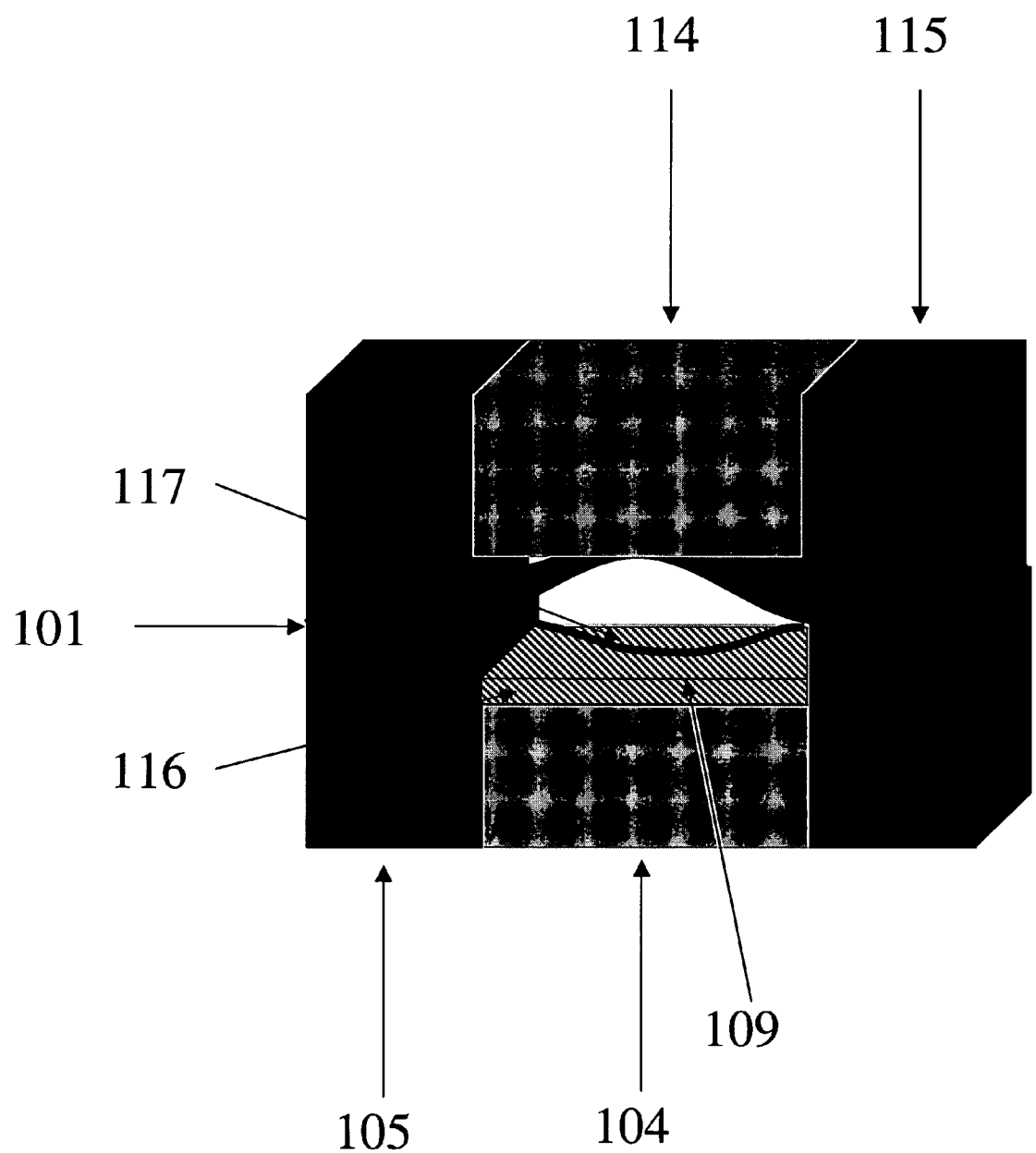

FIGS. 2–4 are cross-sectional diagrams of a cell and illustrate various states of the device for certain embodiments. For example, a given cell may be used to have three states assigned as "on" and "off" states. States 106 and 108 may be assigned as an "off," and state 107 may be assigned as an "on" state 107.

When the device is in state 106, the ribbon 101 is separated from both insulated trace 104 and electrically conductive trace 114 by a distance 110. (The figure may suggest that the distances 110 between the ribbon and a corresponding trace is equal, but they need not be.) This state may be electrically detected in any of a variety of ways described in the foregoing incorporated references.

When the cell is in state 107, "on", shown in FIG. 3, the ribbon is deflected toward trace 114. In the "on" states, the ribbon-trace junction is an electrically conducting, rectifying junction (e.g., Schottky or PN), which may be sensed as such on either the ribbon 101 or trace 104 when addressed.

Switching the element "off" is done, e.g. by creating a force which acts to pull the ribbon away from trace 114. This may be done by applying a voltage to trace 104 such that it acts as a release electrode. When the cell is in "off" state 108, shown in FIG. 4, the ribbon is deflected toward trace 104. In this arrangement, an "off" state corresponds to the ribbon-trace junction being an open circuit, which may be sensed as such on the ribbon 101 when addressed; alternatively, a capacitance may be sensed between the ribbon and trace 104 as an "off" state.

Switching the fabric-based ribbon back "on" is done by causing the fibers to contact trace 114 as above. In the event that individual fibers may remain in contact with the lower electrode 104, such as fiber 117 shown by state 109 in FIG. 4B, electrical cross talk and shorting out is prevented by the presence of the insulative layer 116. Were the lower trace 104 lacking an insulative coating, then it may be difficult to read the "on" and "off" states reliably, as individual conductive fibers of the nanotube fabric would contact both the upper and the lower electrodes 104, 114.

Under certain embodiments in which the lateral spacing between the supports 102 is about 180 nm, the relative separation 110 from the top of an insulating support 102 to the deflected position where the belt 101 attaches to electrode 104 or 114 should be approximately 5–50 nm. The magnitude of the separation 110 is designed to be compatible with electromechanical switching capabilities of the memory device. The 550 nm separation is preferred for certain embodimentsutilizing ribbons 101 made from carbon nanotubes, and reflects the specific interplay between strain energy and adhesion energy for the deflected nanotubes. Other separations may be preferable for other materials.

Switching between these states is, in general, accomplished by the application of specific voltages across the nanotube belt or wire 101 and one or more of its associated traces 104, 114. Switching forces are based on the interplay of electrostatic attraction and repulsion between the nanotube ribbon and the electrodes.

In certain embodiments, there is a high ratio between resistances in the "off" and the "on" states. The differences between resistances in the "off" and "on" states provide a means to read which state a junction is in. In one approach, "readout current" is applied to the nanotube belt or electrode and the voltage across the junction is determined with a "sense amplifier" on the traces. Reads are non-destructive, meaning that the cell retains its state, and no write-back operations are needed as is required with semiconductor DRAMs.

By disposing the ribbons 101 between upper and lower structures 102, 103, the ribbons are effectively sealed and protected. Among other things this facilitates packaging and distribution, and it allows the nanotube-technology arrays to be more easily incorporated into other circuit and systems such as hybrid circuits. The lateral nature of the electrical architecture can also facilitate the production of stackable memory layers and the simplification of various interconnects.

Figure 5:
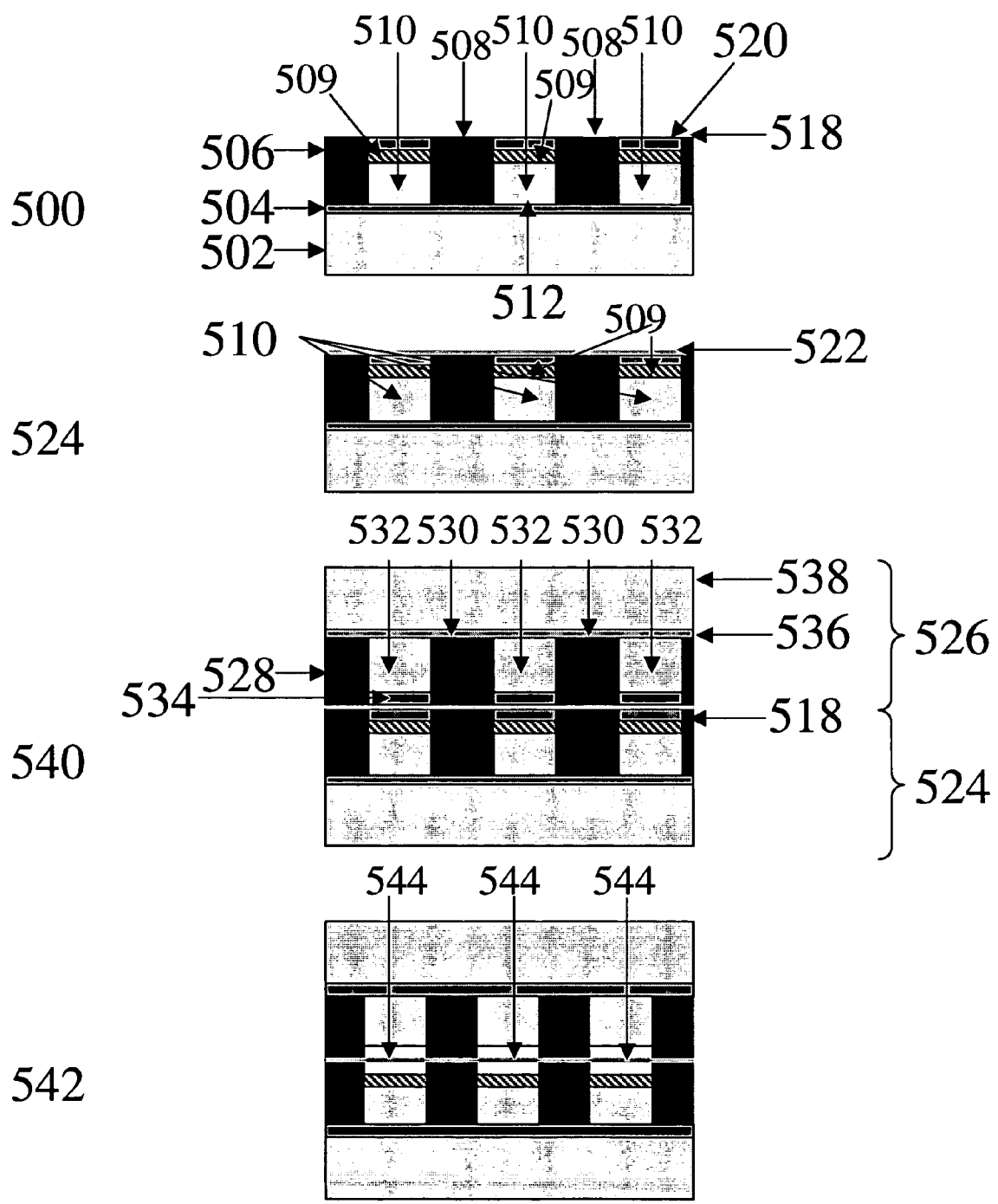
FIGS. 5–9 illustrates exemplary acts of forming electromechanical devices according to certain embodiments of the invention.

FIG. 5 illustrates a method of making certain embodiments of NTRCM devices 100. A first intermediate structure 500 is created or provided as explained in the incorporated patent applications, cited above with an additional step of forming an insulative layer over the conductive trace as outlined below. The structure 500 includes a silicon substrate 502 having a gate dielectric layer 504 (such as silicon dioxide) and an insulating support layer 506 (such as spin-on-glass (SOG)) that contains a plurality of supports 508. In this instance, the supports 508 are formed by rows of patterned insulating material, though many other arrangements are possible, such as a plurality of columns.

Conductive traces 510 extend between supports 508. These conductive electrodes can be fabricated from a single material such as n-doped silicon or from a combination of material layers including metal and silicon layers. Acceptable materials for the conductive electrodes include copper, titanium, tungsten, and platinum, or other metals or semiconductors, such as silicon, compatible with standard fabrication lines. In this instance, the traces 510 are shown as essentially contacting the supports 508, but other arrangements are possible, as are other geometries, such as ones characterized by non-rectangular transverse cross-sections (e.g., triangular or trapezoidal). Insulative material 509 is disposed on conductive traces 510. Exemplary methods of forming such a layer is by applying insulative material to the surface of the conductive traces 510 and by oxidizing the surface of the conductive traces 510.

Sacrificial layers 518 are disposed above the conductive traces 510 so as to define one planar surface 520 with the upper surface of the supports 508. This planar surface, as has been explained previously in the incorporated applications, facilitates growth of a non-woven fabric of single-walled carbon nanotubes (SWNTs) which is primarily one nanotube thick; it is also useful as a substrate for spin-on application of nanofabric.

Under certain embodiments, a nanotube film is first grown on or applied to surface 520 and then patterned, e.g., by photolithography and etching, to define a layer of ribbons 522 (see also 101 in FIG. 1). The ribbons of non-woven nanotube fabric lie on the planar surface 520 and cross (for example, perpendicularly) the underlying traces 510. The resulting intermediate structure 524 is the lower structure 102 referred to above, with the exception that structure 524 includes the sacrificial layer 518.

The lower intermediate structure 524 may be formed in many ways. Several such ways are described in the incorporated patent applications, cited above. In addition, various ways are implicitly suggested through the description below of different ways of constructing analogous structures sitting on top of the lower array. An upper intermediate structure 526 may be formed separately, and it may be placed on top of the patterned carbon nanotube film layer 522 to yield intermediate structure 540. Like the lower intermediate structure 524, the upper intermediate structure 526 includes an insulating support layer 528 (e.g., SOG) that contains a plurality of supports 530. In the pictured embodiment, the supports 530 consist of rows of patterned insulating material, but, as with the lower structure, many arrangements are possible, such as ones containing a plurality of columns. Moreover, the insulating supports may be made from a variety of materials. While the conductive traces 510 of the lower portion 524 are shown with an insulative coating, 509, it is within the scope of the invention to have upper traces 532 coated with insulative material. Such a structure and method of fabrication is not shown for the sake of simplicity.

Conductive traces 532, separated from the nanotubes by a second set of sacrificial layers 534, extend between supports 530. The conductive traces 532 are shown as essentially contacting the supports 530, but other arrangements and geometries are possible, as described for the conductive traces 510 in intermediate 500. A gate dielectric layer 536 and a conductive ground layer 538 are deposited on top of the supports 530 and traces 532.

To generate the target structure 542 featuring suspended, tristable nanotube junctions 544, the lower and upper sacrificial layers 518 and 534, respectively, have to be removed from intermediate structure 540, as by using wet or dry chemical etchants including acids or bases.

Before describing methods for producing the upper array 526 in greater detail, a few aspects regarding the fabrication process and its product are worth pointing out. The first is that the various growth, nanotube application, patterning, and etching operations may be performed using conventional techniques, such as lithographic patterning. Currently, these techniques can lead to feature sizes (e.g., the width of ribbon 101) of about 180 nm to as low as 130 nm, but the physical characteristics of the components are amenable to even smaller feature sizes that may be accessible to future manufacturing processes.

A second point is that, in the case of CVD grown nanotube fabrics (but not in the case of spin on application of nanotube-based fabrics), because the nanotube ribbons are in place before construction of the upper array begins, there is some more flexibility in the choice of materials for the upper array. In particular, while the choice of materials for the lower electrodes is limited to those substances that will survive the high temperature of the nanotube growth process, the choice of materials for the upper electrodes is not so constrained. In the case of spin-on application of the nanotube-based fabric, room temperature operation is possible throughout the fabrication process, thus creating no limitation for substrate choice.

The final point is that interconnect fabrication can be applied using standard metallization and CMOS logic or using nanoelectromechanical addressing as previously explained in the incorporated patent applications, cited above. Three possible methods for generating the upper intermediate structure 526 are described in connection with FIGS. 6A–B, FIGS. 7A–B, and FIGS. 8A–B.

Figure 6A:
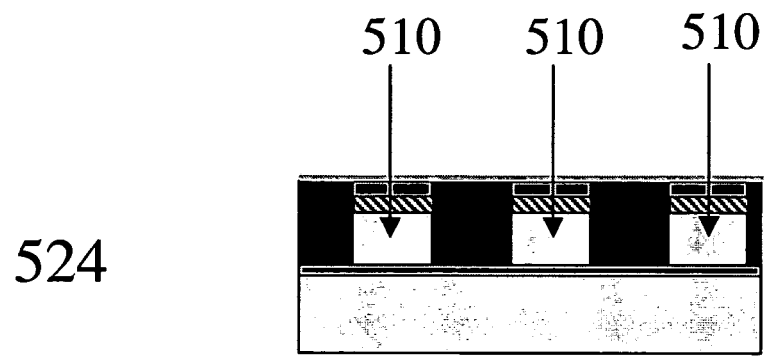
Figure 6A:
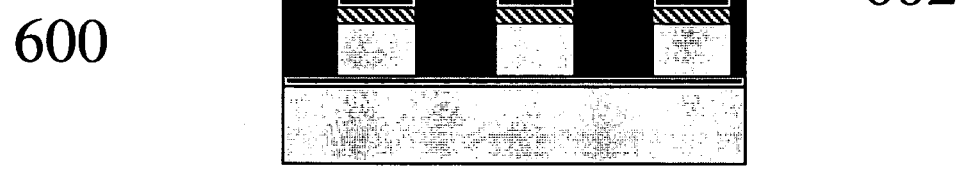
Figure 6A:
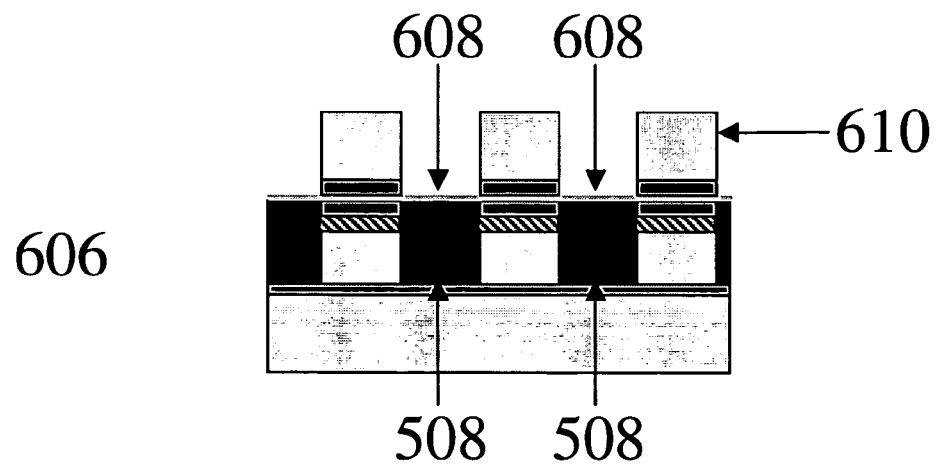
Figure 6B:
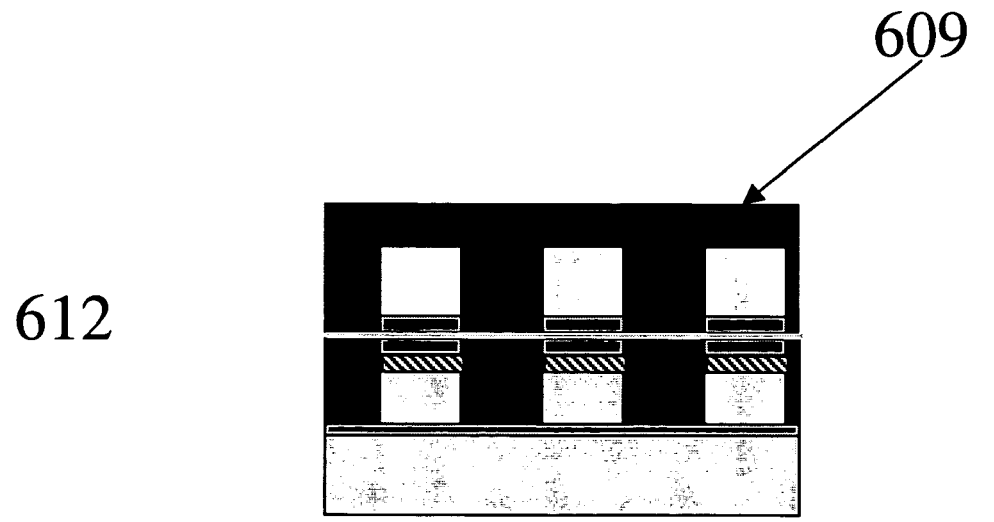
Figure 6B:
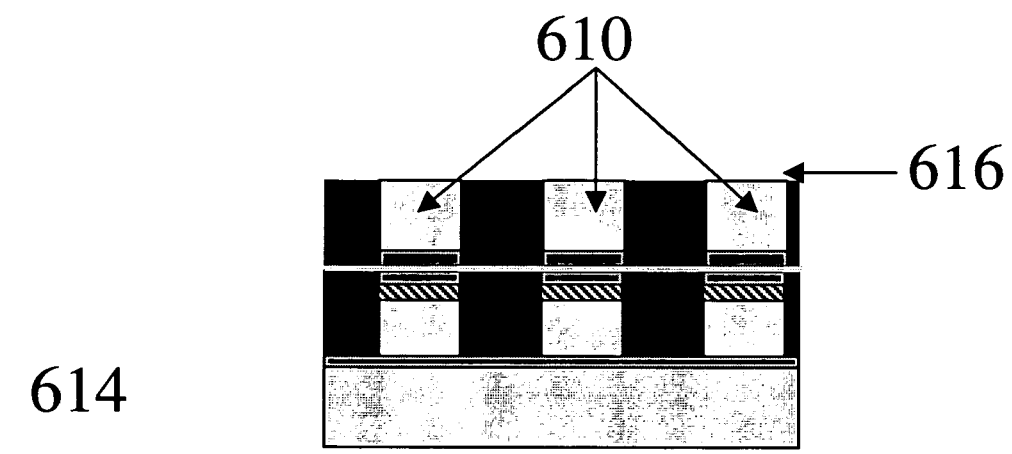
Figure 6B:
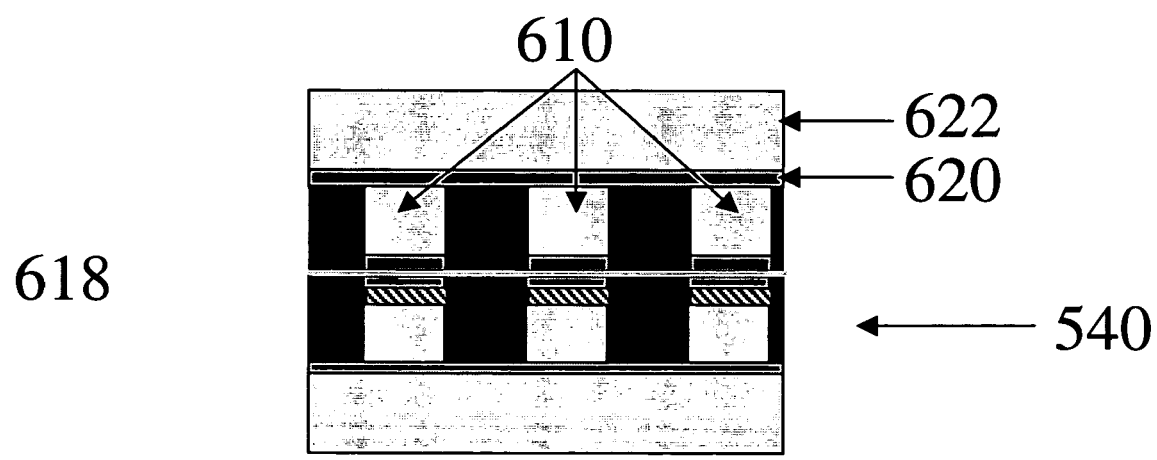

FIGS. 6A–B show one approach for producing a three-trace structure 542. A lower intermediate structure 524 is provided or constructed using the techniques identified above. A sacrificial layer 602 (about 10–20 nm high) and an n-doped silicon layer 604 are then added using a CVD process, sputtering, electroplating, or a different deposition process.

To generate the conductive traces 610, a photoresist layer may be spin-coated on layer 604 and subsequently exposed and developed to create cavities which lie directly over the underlying supports 508.

Reactive ion etching (RIE) or the like may then be used to etch the electrode and sacrificial layers 604 and 602 to form cavities 608 and to define upper-layer electrodes 610 that are positioned directly above the underlying electrodes 510. As shown in FIG. 6B, the cavities 608 are then filled and covered with a planar layer 609 of insulating material such as spin-on-glass (SOG) or polyimide. The insulating layer 609 is backetched with RIE or a plasma to the same height as the electrodes 610 so as to form a planar surface 616. A gate dielectric layer 620 is provided above the surface 616 to separate the electrodes 610 from the upper electrical ground layer 622. This layer 622 serves the additional purpose of providing a hermetic seal covering the entire memory structure.

The resulting intermediate structure 540 is then processed so that the lower and upper sacrificial layers 518 and 534, respectively, are removed to result in structure 542, as discussed above in connection with FIG. 5.

Figure 7A:
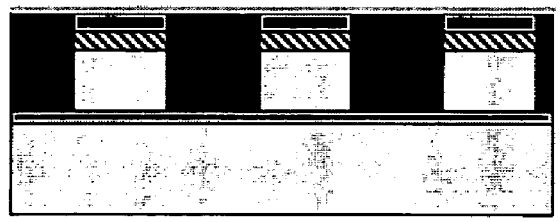
Figure 7A:
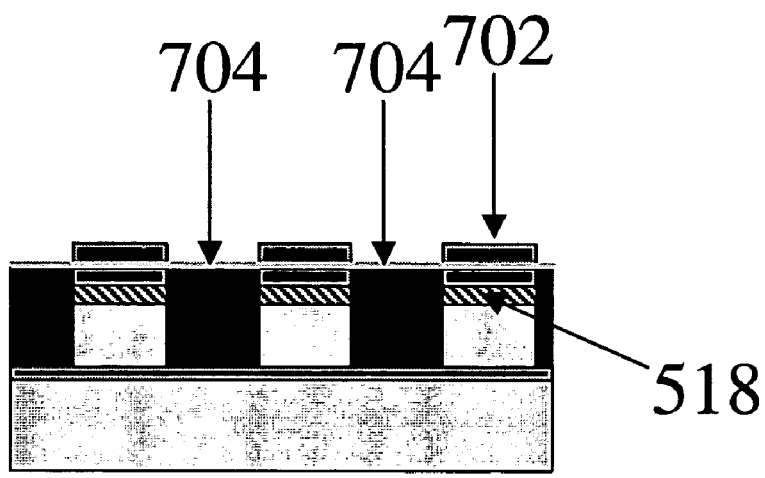
Figure 7A:
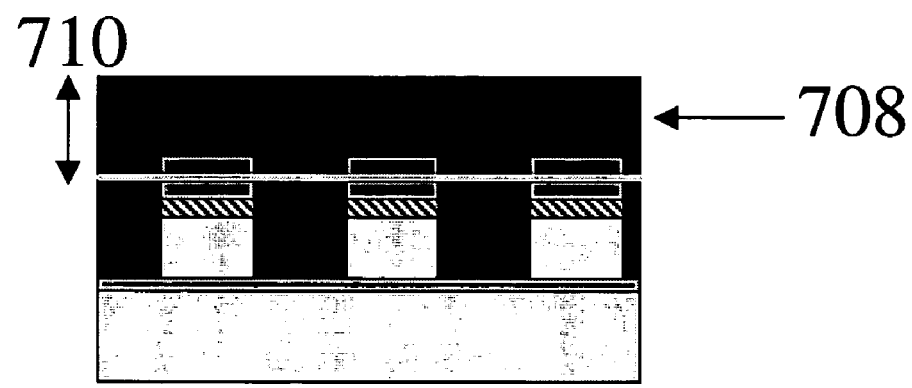
Figure 7B:
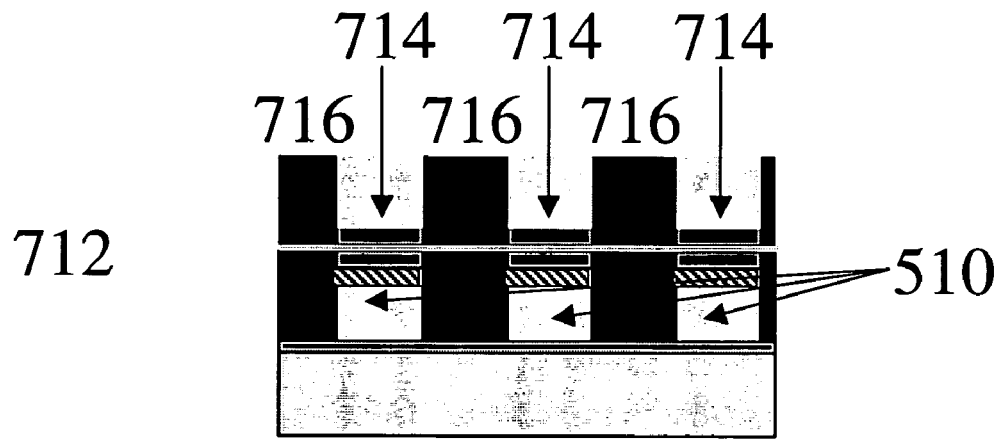
Figure 7B:
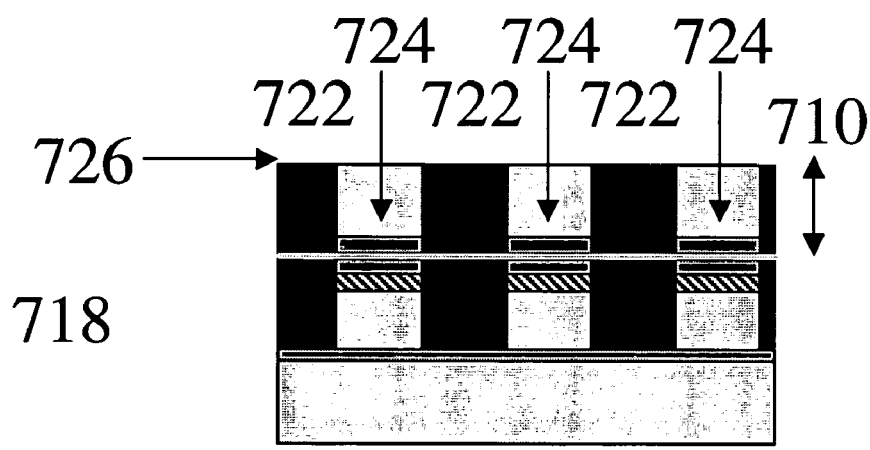
Figure 7B:
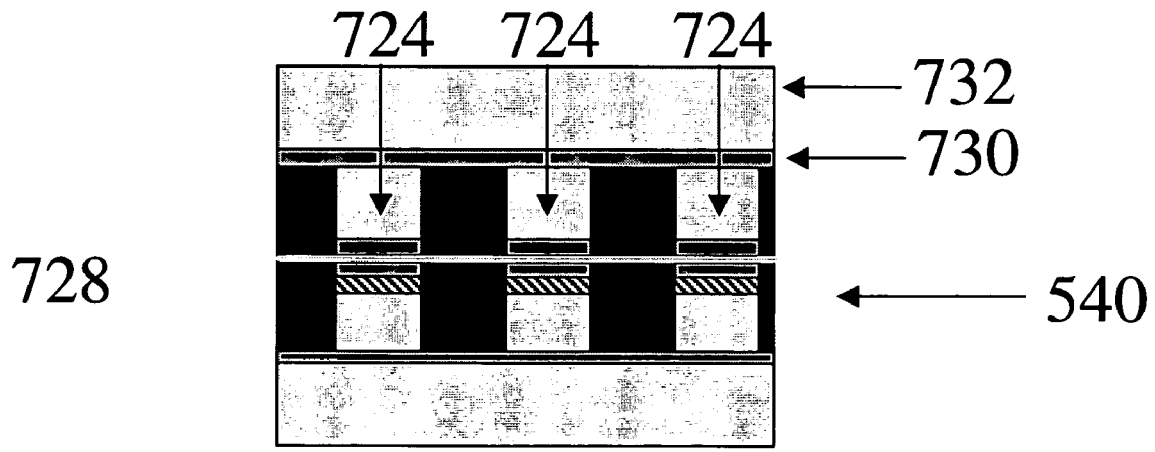

FIGS. 7A–B show another approach for producing a three-trace structure 542. A lower intermediate structure 524 like that described in connection with FIG. 5 is provided or constructed. A sacrificial layer 702 (about 10–20 nm high) can be selectively grown directly above the underlying sacrificial layer 518, e.g., by using a selective CVD process involving self-complementary materials such as titanium, to produce intermediate structure 700. The resulting cavities 704 are filled and covered with a planar layer 708 of an insulating material such as spin-on-glass (SOG) or polyimide. The insulating layer 708 is backetched with RIE or a plasma to a height 710 equal to the intended total height of the upper sacrificial layer 702 and the upper conductive electrodes 724. A photoresist layer may be spin-coated on layer 708 and subsequently exposed and lithographically developed to create cavities which lie directly over the underlying electrodes 510.

As illustrated by FIG. 7B, reactive ion etching (RIE) or the like may then be used to etch the upper support layer 708 to form cavities 714 and to define the upper supports 716. The cavities 714 are filled and covered with a planar layer consisting of n-doped silicon or other suitable electrode-forming materials, and this layer is backetched with RIE or a plasma to the same height 710 as the remaining portions of the support layer 722, the result being intermediate 718. The top surfaces of the upper electrodes 724 and the supports 722 form a planar surface 726. A gate dielectric layer 730 is deposited on top of intermediate structure 718 to separate the upper electrodes 724 from the upper electrical ground conductive layer 732 (e.g., silicon), which is added on top of the gate dielectric layer. This results in structure 540 like those described above. Layer 732 serves the additional purpose of providing a hermetic seal covering the entire memory structure.

The resulting intermediate structure 540 is then processed so that the lower and upper sacrificial layers 518 and 534, respectively, are removed to result in structure 542, as discussed above in connection with FIG. 5.

Figure 8A:
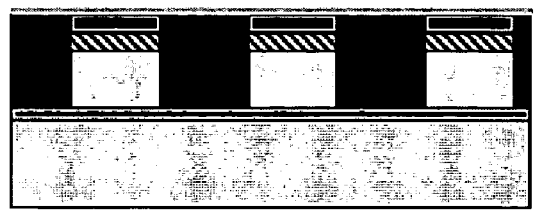
Figure 8A:
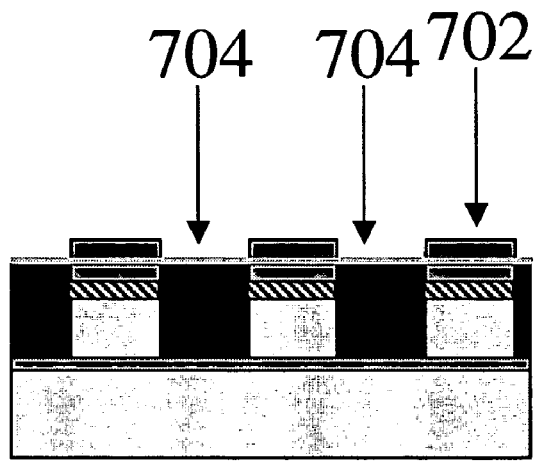
Figure 8A:
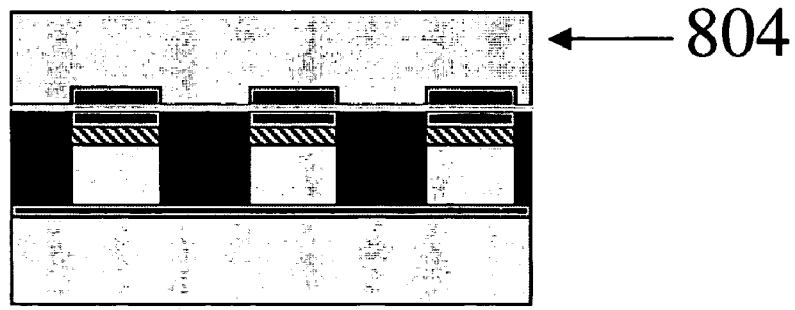
Figure 8B:
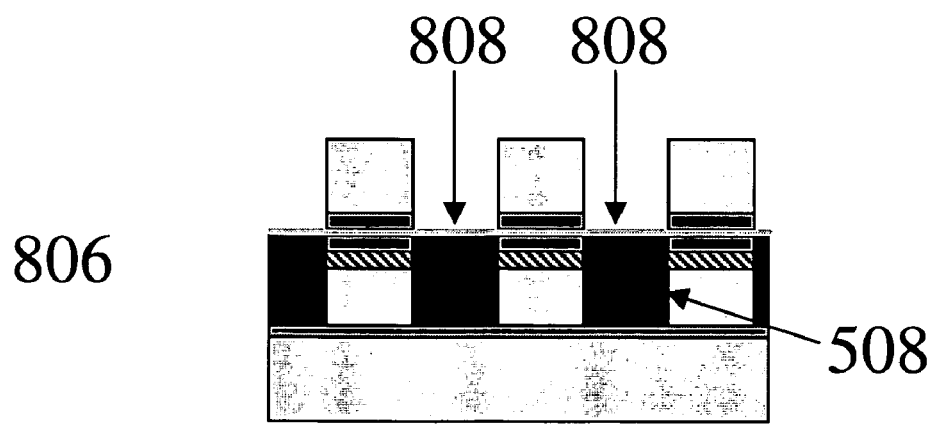
Figure 8B:
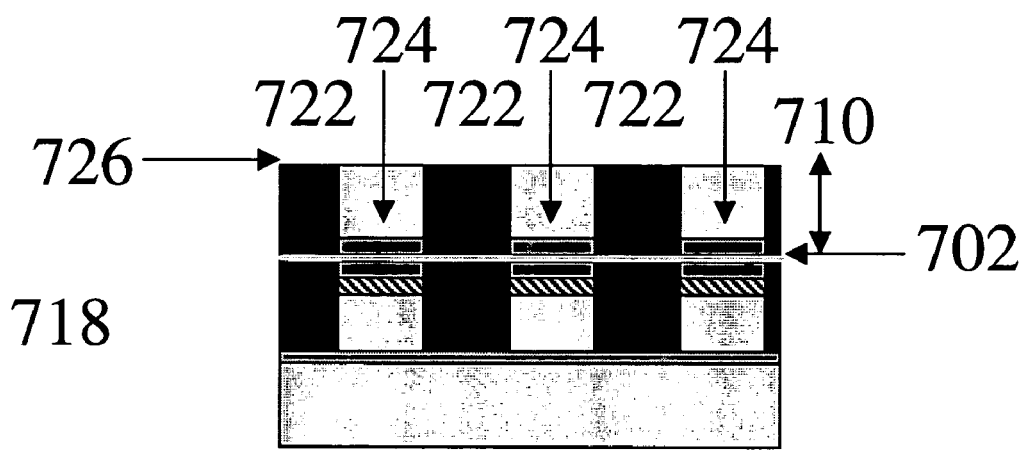
Figure 8B:
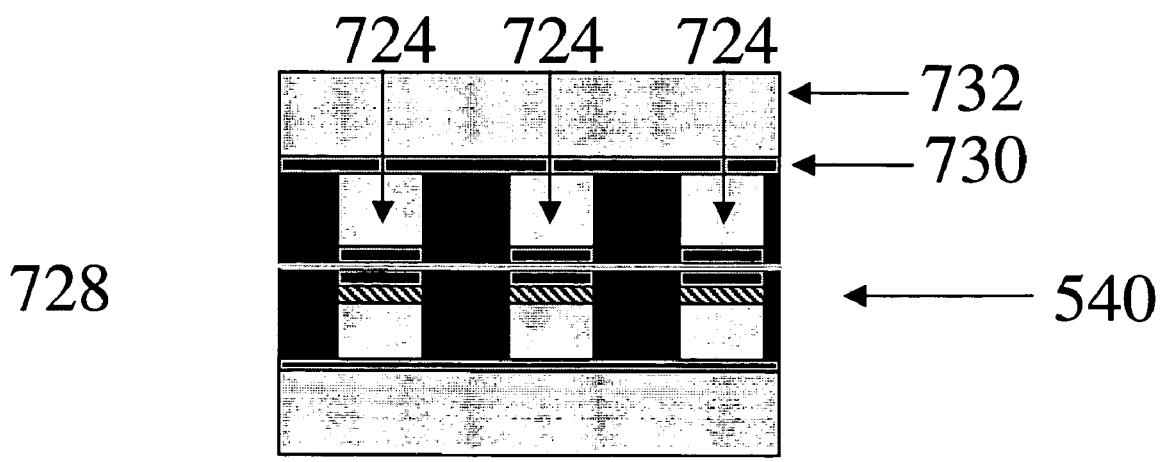

FIGS. 8A–B show another approach for producing a three-trace structure 542. Intermediate structure 700 (as explained above) is provided or created. Under this approach, though, the cavities 704 are filled with n-doped silicon or other suitable electrode-forming materials to form a planar layer 804. The electrode layer 804 is backetched with RIE or a plasma to approximately the same height 710 as previously described. A photoresist layer may be spin-coated on layer 804 and subsequently exposed and lithographically developed to begin the creation of cavities 808 which lie directly over the underlying supports 508.

As illustrated in FIG. 8B, reactive ion etching (RIE) or the like may then be used to complete the cavities 808 and to define the upper electrodes. The cavities 808 of intermediate 806 are then filled and covered with a planar insulating layer, consisting, for example, of SOG or polyimide. The insulating layer is backetched with RIE or a plasma to form the supports 722 with a height 710 equal to the total height of the upper sacrificial layer 702 and the upper silicon electrodes 724. The result is intermediate structure 718, with a flat surface 726 as previously described. Substrate 718 is converted into substrate 728 by adding gate dielectric and upper electrical ground layers as described above.

The resulting intermediate structure 540 is then processed so that the lower and upper sacrificial layers 518 and 534, respectively, are removed to result in structure 542, as discussed above in connection with FIG. 5.

Under other embodiments of the invention, the upper electrodes are not located directly over the lower electrodes but, instead, are shifted (e.g., displaced by half their width) relative to the lower electrodes. This approach, among other things, facilitates the use of certain techniques for removing sacrificial layers.

Figure 9:
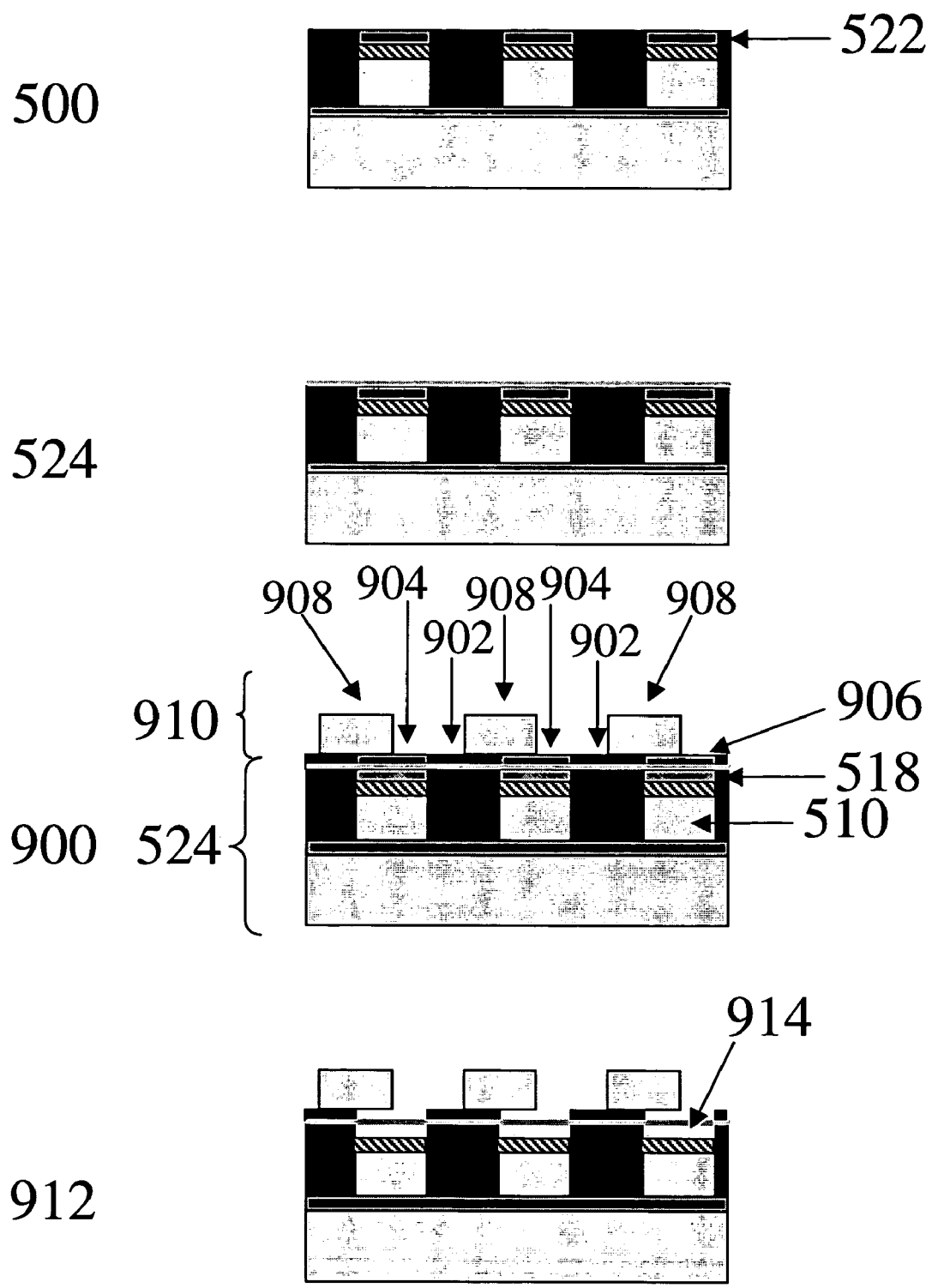

FIG. 9 illustrates a method of making these "shifted" embodiments of NTRCM devices. A first intermediate structure 500, as described above, is created or provided. Structure 500 is then converted, as described above, to intermediate 524 featuring patterned nanotube ribbons 522 on top of intermediate 500. Upper insulating supports 902 are deposited onto the lower supports 508, and upper sacrificial layers 904 having the same height as the upper supports 902 are deposited on top of ribbons 522 but in alignment with the lower sacrificial layers 518, so as to create a flat surface 906. The height of the upper sacrificial layers 904 and upper supports 902 is approximately the same as the height of the lower sacrificial layer 518; e.g., 10–20 nm on average. The upper supports 902 and upper sacrificial layers 904 may be made of the same materials as the corresponding lower layers but are not limited to these materials.

Conductive traces 908 of n-type silicon electrodes, or some other suitable material or material combination, are provided on top of the flat surface 906 so that they run parallel to the lower conductive traces 510 and so that at least a portion of the traces 908 (but not their entirety) are aligned with the traces 510. The completed upper array 910 of the resulting intermediate 900 includes upper supports 902, upper sacrificial layers 904, and upper electrodes 908. The upper conductive traces 908 in intermediate 900 are not directly located above the lower electrode traces 510, but are shifted a certain amount (e.g., by half their width) relative to the lower traces 510.

To generate the freely suspended tristable nanotube junctions 914 of the target structure 912, the lower sacrificial layer 518 and upper sacrificial layer 904 are removed using wet or dry chemical etchants including acids or bases.

The upper traces 908 are shown as having rectangular cross-sections and widths similar to those of the lower supports 508 and lower electrodes 510, but neither the shapes nor the widths of the upper traces 908 is limited to these parameters. Narrower or wider traces of different cross-sections, e.g., trapezoidal or triangular, can be envisioned. Furthermore, while the choice of material for the lower array 524 is somewhat limited so that the materials are compatible with the growth conditions for the carbon nanotubes or nanotube fabrics (e.g., relatively high temperature) when high temperature fabrication is used, the upper array 910 is fabricated after nanotube growth so that a wider variety of materials can be used for the upper supports 902, upper sacrificial layers 904, and upper electrodes 908. For example, materials that are only stable up to relatively low temperatures, such as polyimides, other polymers or low melting point metals (e.g. aluminum), can be used for the upper array 910.

Figure 10:
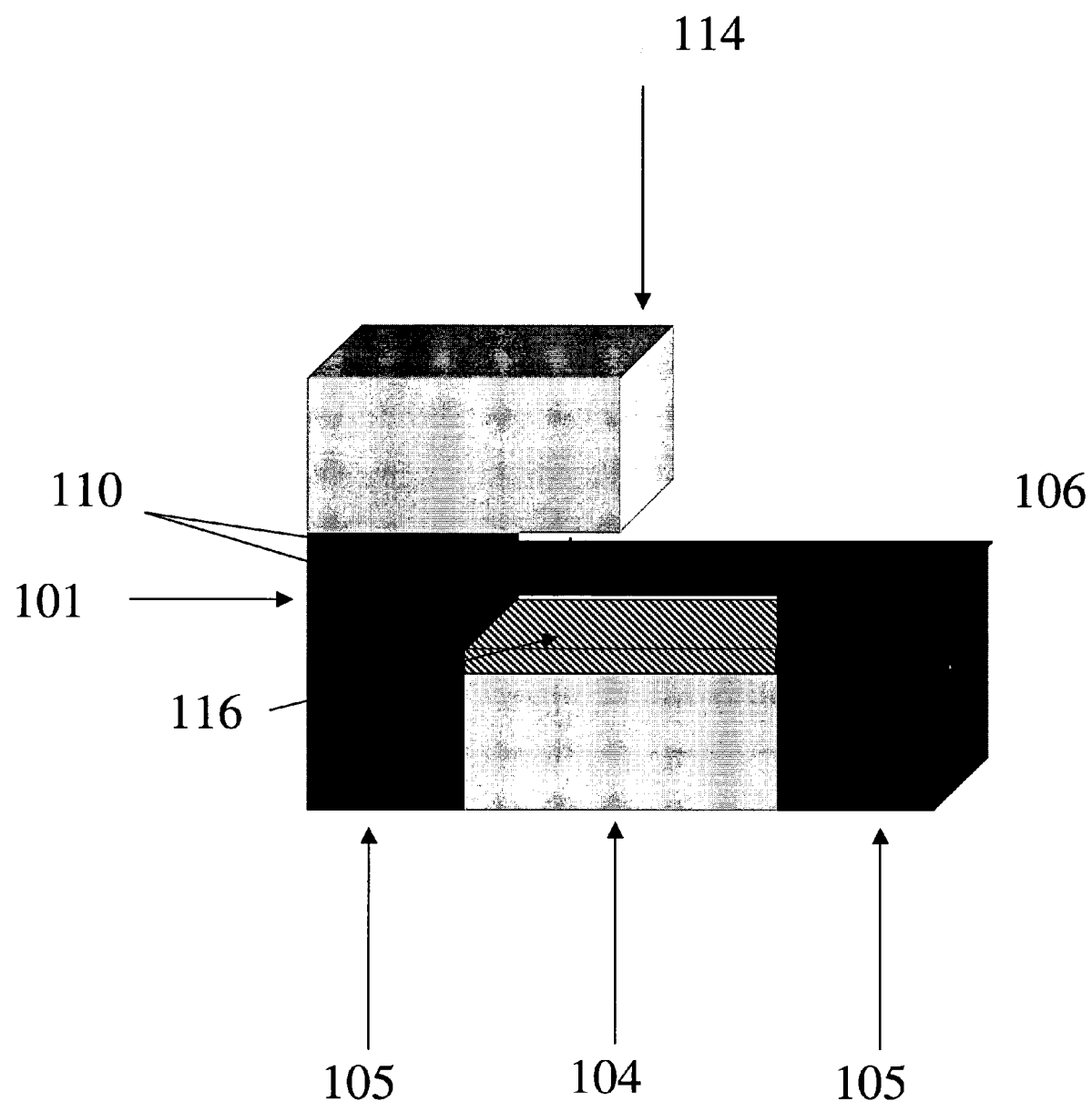
FIGS. 10–12 illustrate three states of a memory cell according to certain embodiments of the invention.
Figure 11:
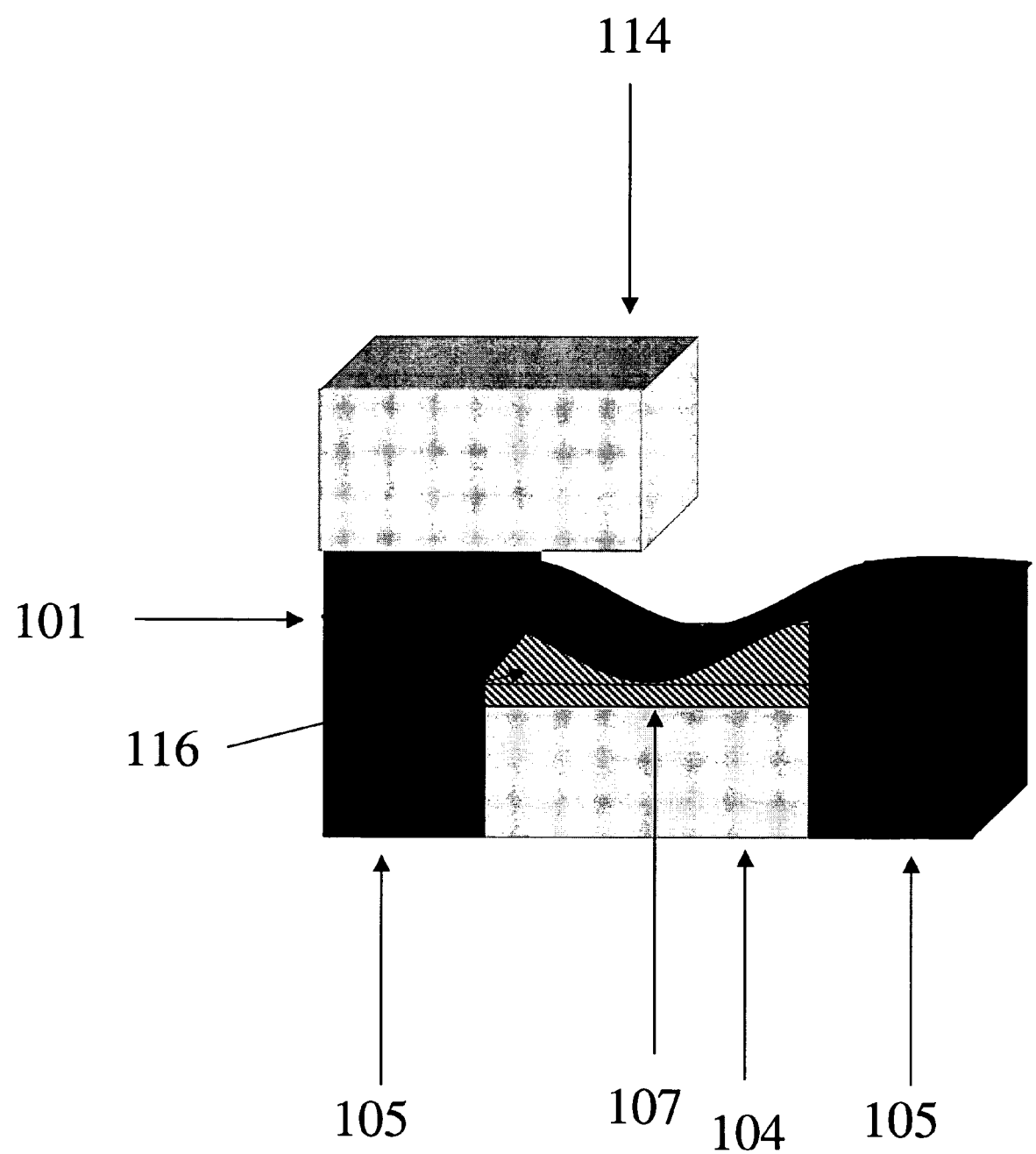
Figure 12:
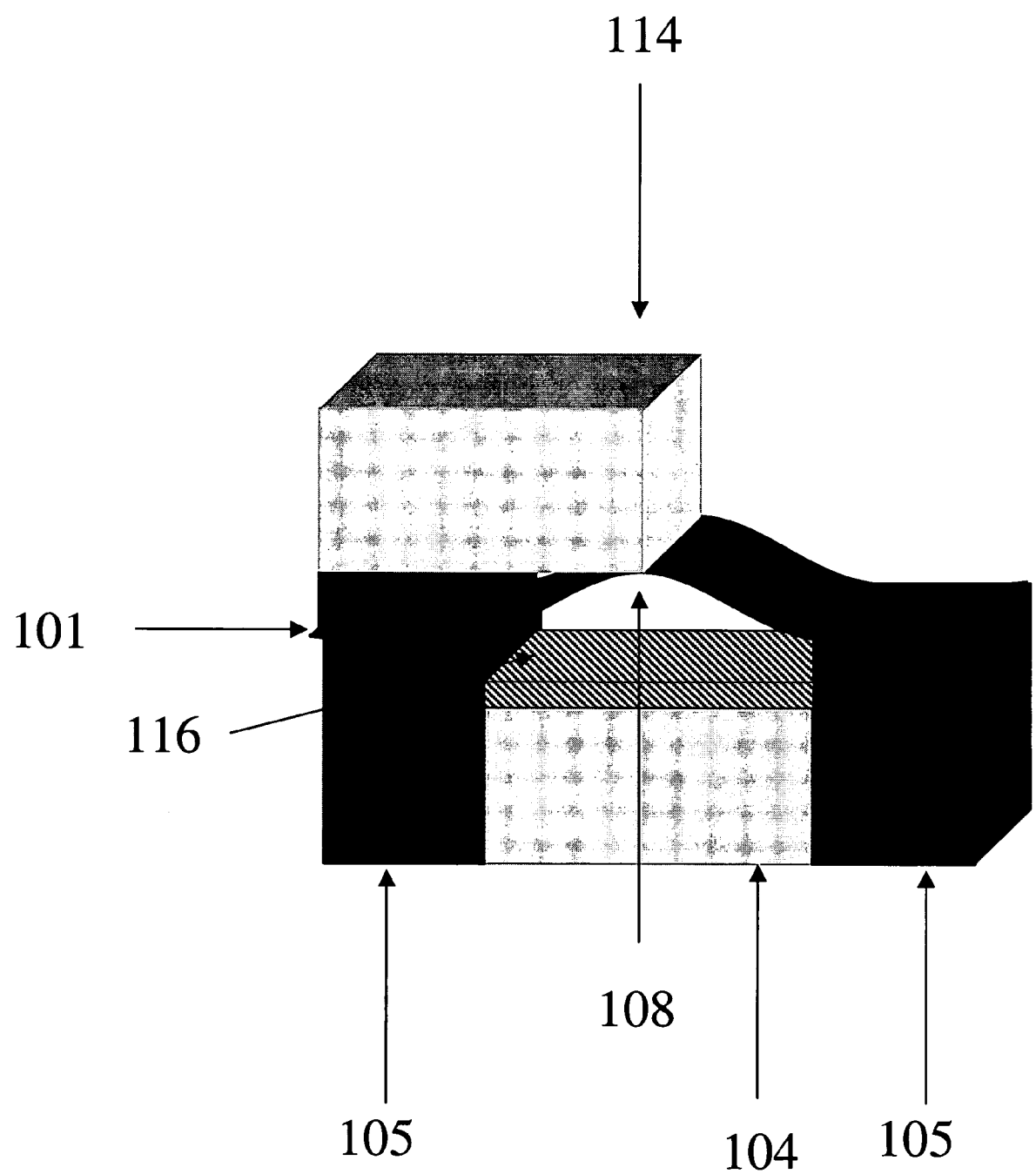

FIGS. 10–12 are cross-sectional diagrams of a cell having a shifted upper electrode and illustrate various states of the device. Analogously to the above embodiments, the states may be assigned with some meaning, such as "on" and "off" states, or assigned to non-binary encoding. For example, FIGS. 10 and 11 show a junction that may be assigned as "off" state 2, whereas FIG. 12 shows a junction in an "on" state. The description of these states is analogous to that of FIGS. 2–4 and thus will not be repeated. Like reference numerals to those of FIGS. 2–4 have been used to show corresponding features of these embodiments and states.

Figure 13A:
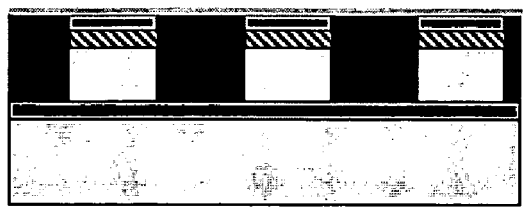
FIGS. 13–18B illustrate more particular acts of forming electromechanical devices according to certain embodiments of the invention.
Figure 13A:
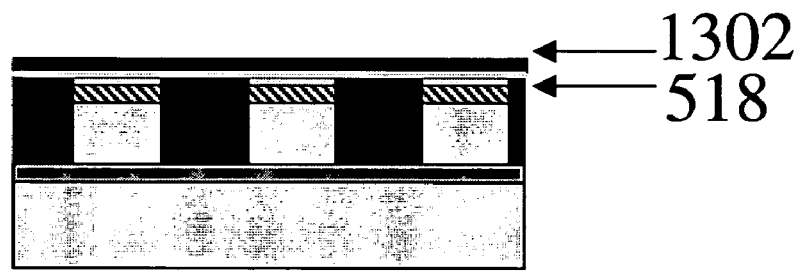
Figure 13A:
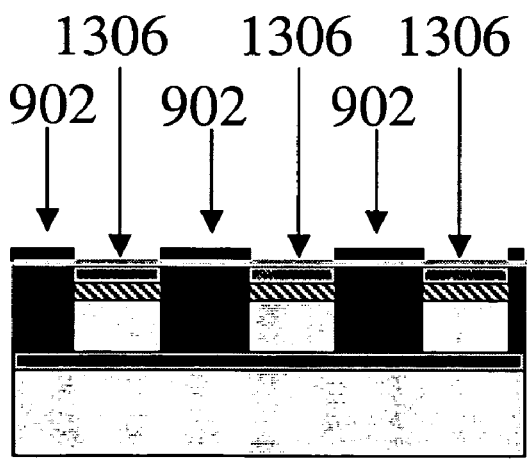
Figure 13B:
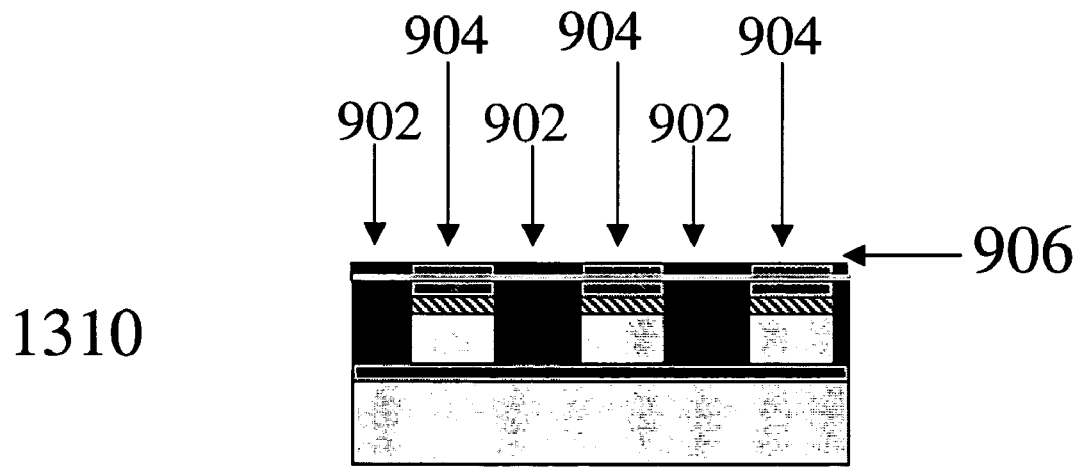
Figure 13B:
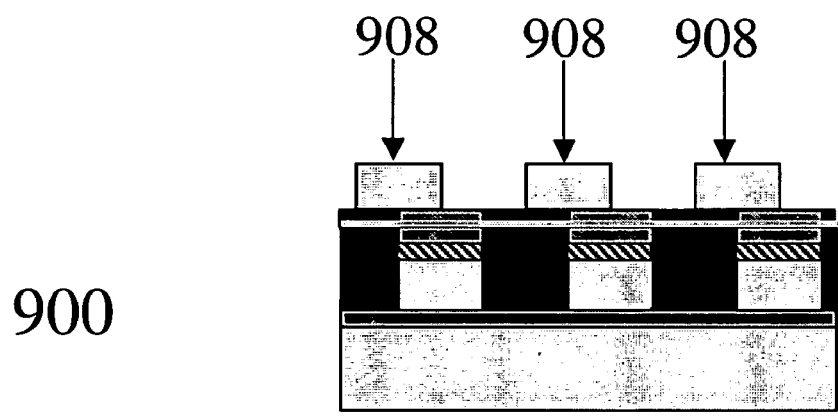
Figure 13B:
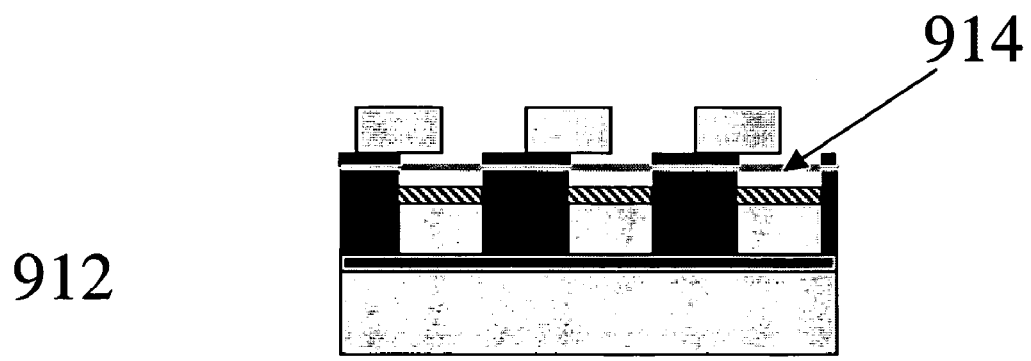

FIGS. 13A–B show one approach for producing a three-trace structure 912. A lower intermediate structure 524 is provided or constructed using the techniques identified above. A support layer 1302 of about the same height as the lower sacrificial layer 518 is deposited to generate intermediate structure 1300. The layer 1302 is then patterned by photolithography and etching techniques, such as RIE, to create the supports 902 and to define cavities 1306 of intermediate structure 1304.

The cavities 1306 are filled with a planar sacrificial layer which is then backetched by RIE or some other etching technique until the sacrificial layer 904 has the same height as the upper supports 902 and a planar surface 906 is formed. The intermediate structure 1310 so formed then has a layer of electrode material, such as n-type silicon, deposited on top of surface 906, which is then patterned by photolithography and etching techniques, such as RIE, to define conductive electrode traces 908 and to form intermediate structure 900.

The upper and lower sacrificial layers 904 and 518 are then removed, as explained in conjunction with FIG. 9, to generate the freely suspended, tristable nanotube junctions 914 of the target structure 912.

Figure 14A:
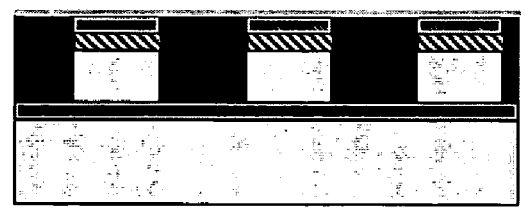
Figure 14A:
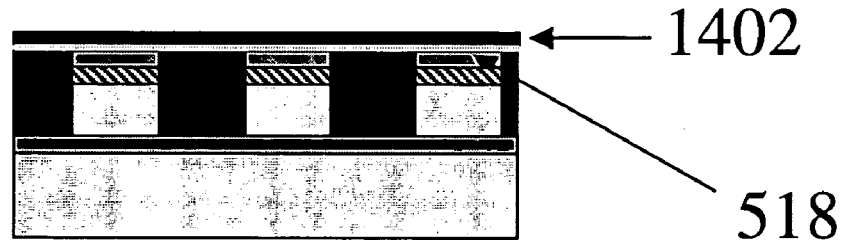
Figure 14A:
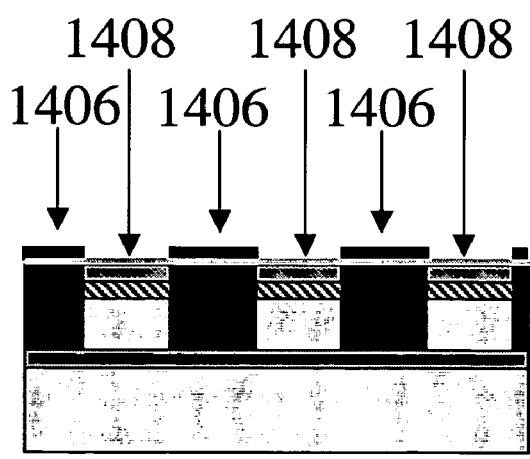
Figure 14B:
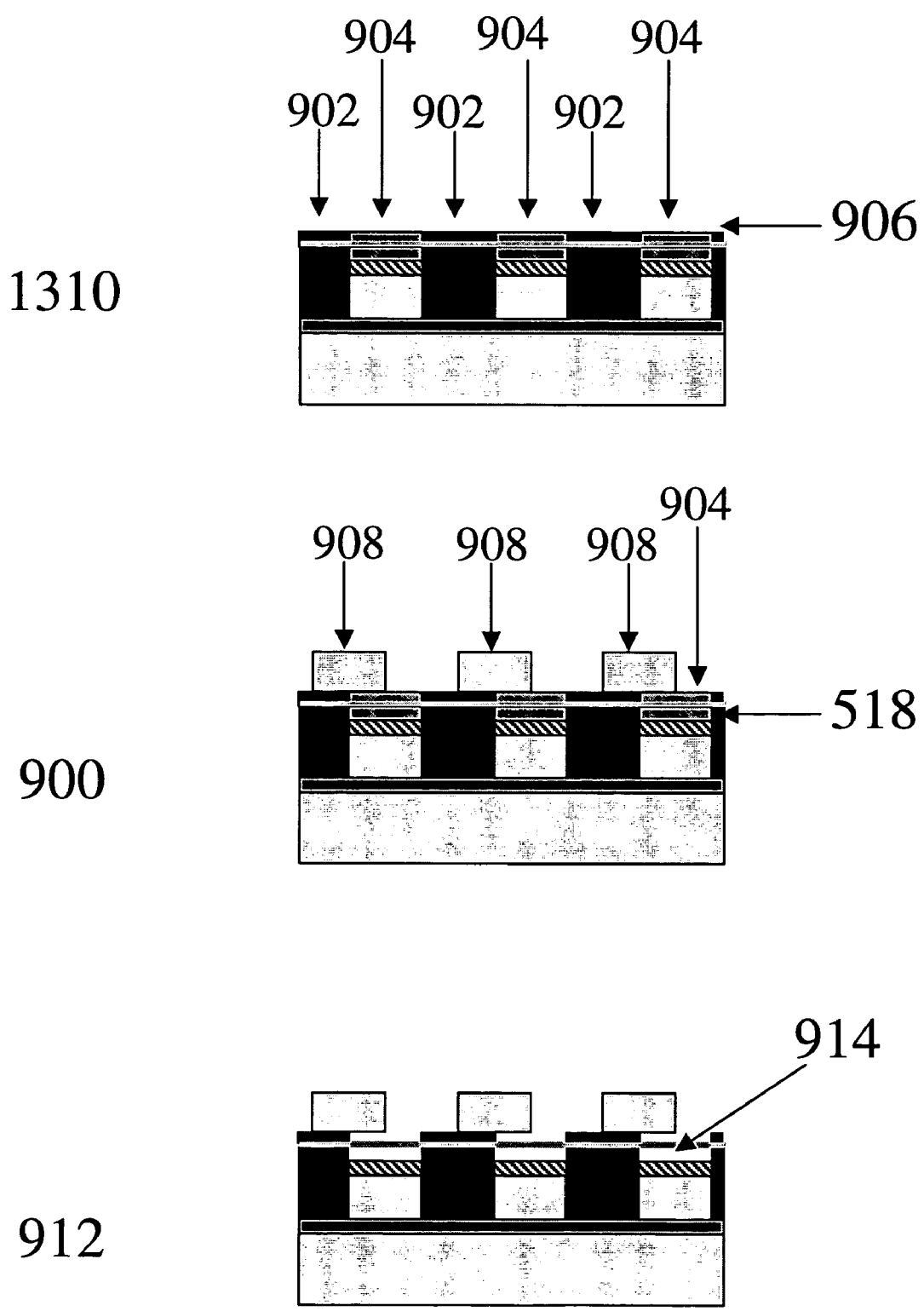

FIGS. 14A–B show another approach for producing a three-trace structure 912. Intermediate structure 524 is provided or created and then transformed into intermediate 1400 by evaporation onto its surface of an upper sacrificial layer 1402 of about the same height as the lower sacrificial layer 518. This sacrificial layer is then patterned by lithography and etching to form sacrificial layer lines 1406 separated by cavities 1408 of intermediate 1404.

The cavities 1408 are then filled by a flat layer of support material which is backetched to the same height as the sacrificial layer lines 904 to form a flat surface 906 and to form intermediate structure 1310. Intermediate 1310 is converted into intermediate 900 as explained in conjunction with FIG. 13B. The upper and lower sacrificial layers 904 and 518 are removed to form the target structure 912 containing freely suspended, tristable nanotube junctions 914.

Figure 15:
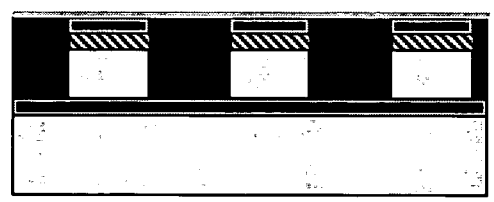
Figure 15:
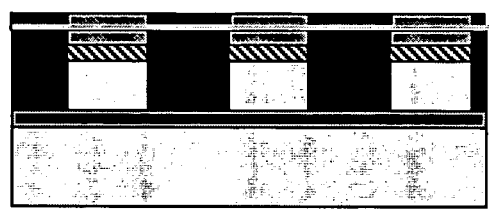
Figure 15:
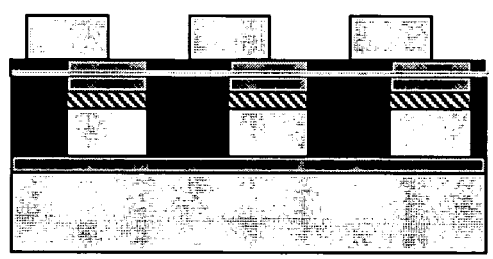
Figure 15:
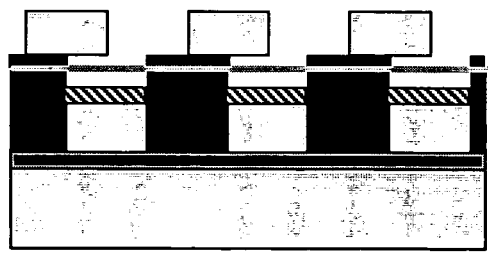

FIG. 15 shows another approach for producing a three-trace structure 912. First, support layers 902 (about 10–20 nm high) are selectively grown on top of the lower structure 524 directly above the lower supports 508; e.g., by using a selective CVD process involving self-complementary materials such as titanium or silicon dioxide. The resulting intermediate 1304 is then converted successively into intermediate 1310, intermediate 900, and finally the target structure 912, as described above in conjunction with FIG. 13B.

Figure 16:
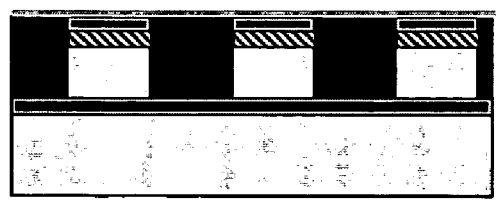
Figure 16:
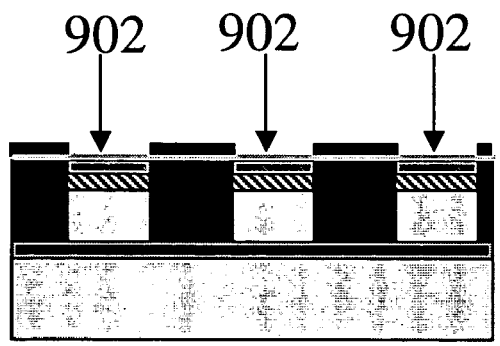
Figure 16:
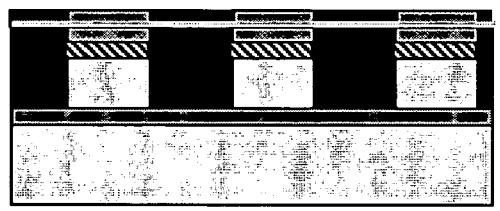
Figure 16:
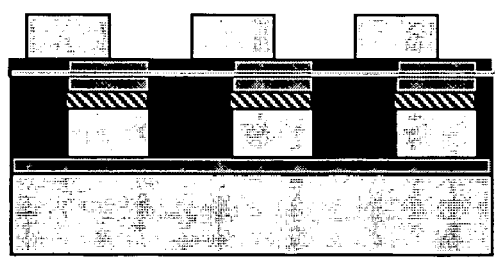
Figure 16:
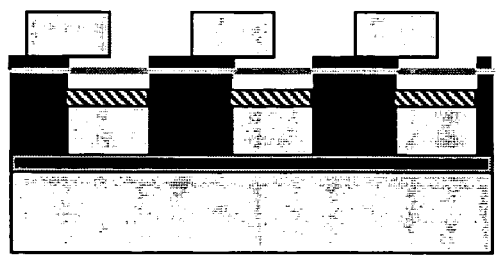

FIG. 16 shows another approach for producing a three-trace structure 912. Sacrificial layers 904 are selectively deposited on the lower array 524 to form intermediate 1404. Intermediate 1404 is then converted via intermediates 1310 and 900 into the target structure 912, as described above in conjunction with FIG. 14B.

Figure 17:
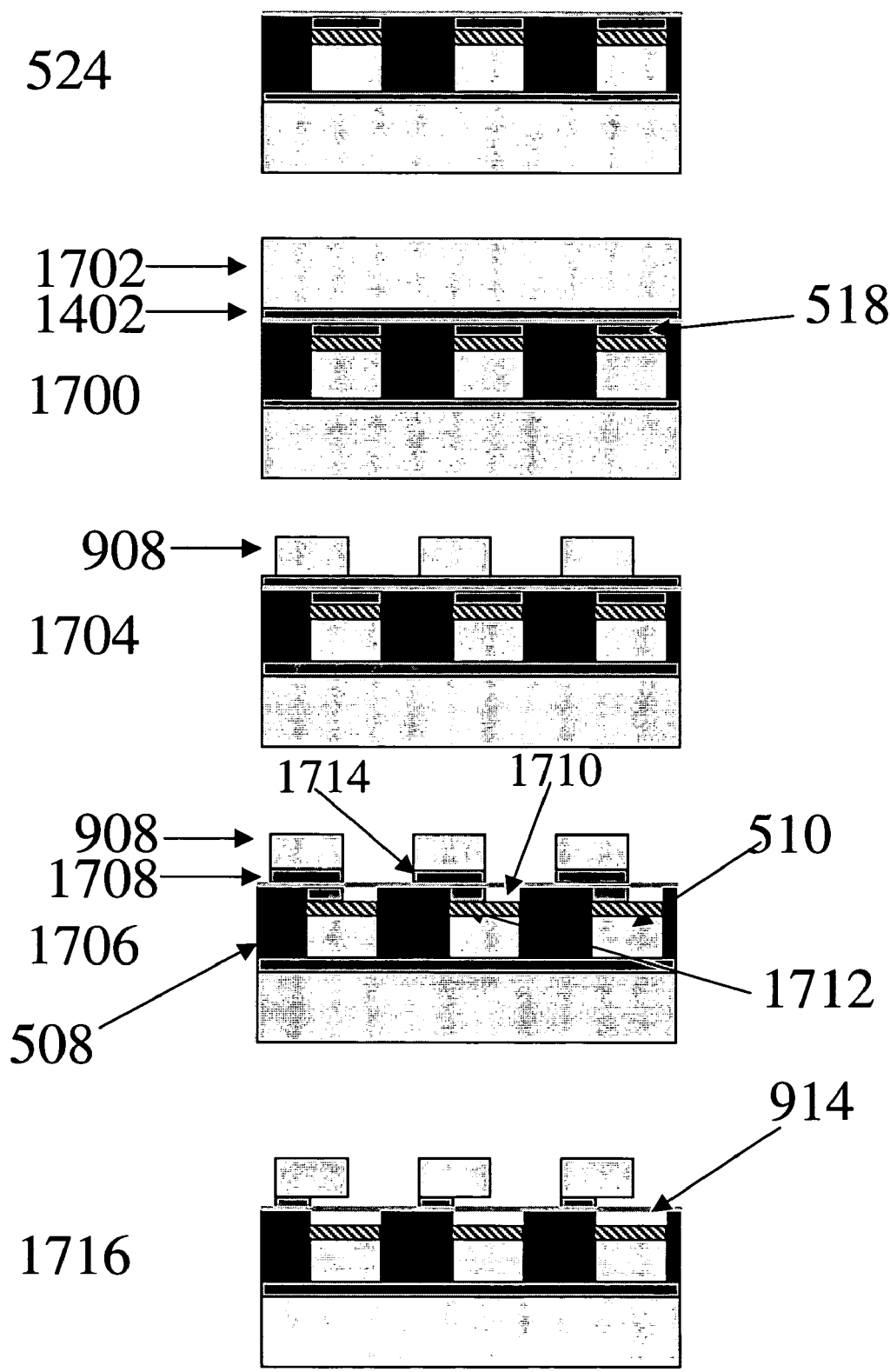

FIG. 17 shows another approach for producing a three-trace structure 912. Intermediate 524 is created or provided. A sacrificial layer 1402, made of the same material as the lower sacrificial layer 518, and an electrode layer 1702 are deposited to form structure 1700. The electrode layer 1702 is then patterned by lithography and RIE to form electrode lines 908. Subsequently, the exposed part of the upper and lower sacrificial layers are removed by RIE to form intermediate 1706. The remaining sacrificial material 1708 is located only underneath the electrode lines 908. Where sacrificial material was removed, the now freely suspended nanotube ribbons form junctions 1710 with a freely suspended length, in the embodiment pictured (in which array elements are assumed to have been made as small as possible), of approximately half the resolution limit of the lithography used for patterning.

To form freely suspended, tristable junctions, the part 1712 of the sacrificial material remaining directly above the lower electrodes 510 is removed. This can be accomplished by utilizing the faster differential solubility of this sacrificial material 1712 compared to the sacrificial material 1714 remaining directly above the lower insulating supports 508. The sacrificial material 1712 directly above the lower electrodes dissolves faster because it is more accessible to the etchant than the part 1714 of the remaining sacrificial layer directly above the lower supports 508. As a result, by applying etchant and then stopping the etching process at the appropriate time, the target structure 1716 featuring freely suspended, tristable nanotube junctions 914 can be fabricated.

Figure 18A:
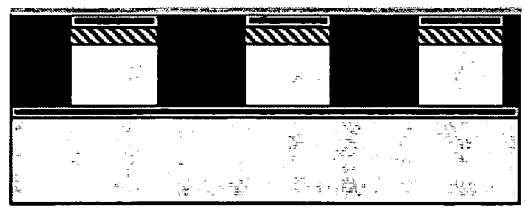
Figure 18A:
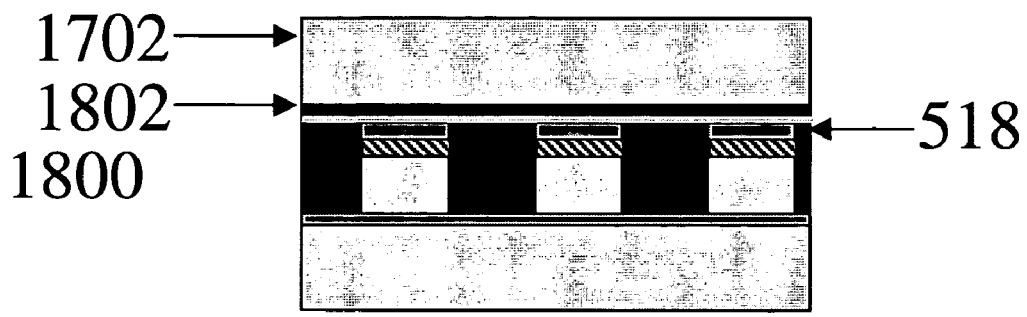
Figure 18A:
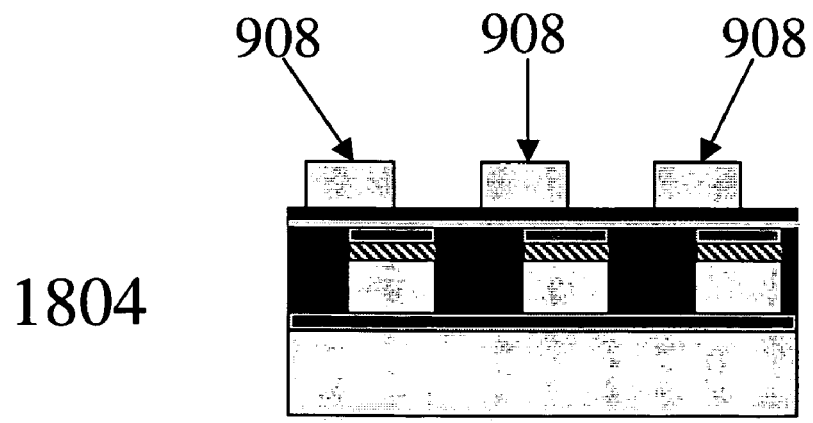
Figure 18B:
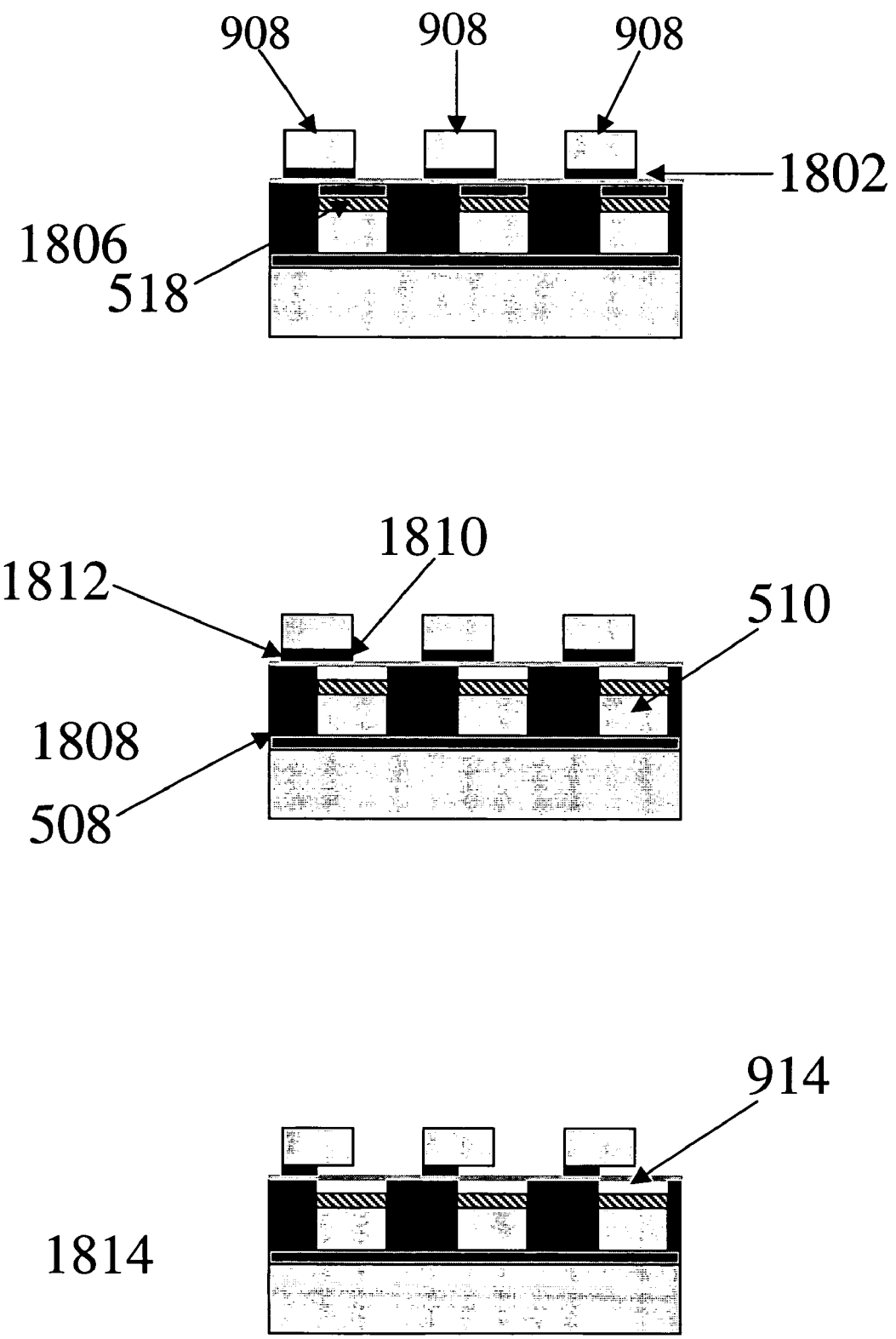

FIGS. 18A–B illustrate yet another approach for producing a three-trace structure 912. Intermediate 1800 is produced by evaporating a sacrificial layer 1802 and an electrode material layer 1702 onto intermediate 524. The upper sacrificial layers 1802 are made of a material that has different etching characteristics than the lower sacrificial layers 518.

The electrode material layer 1702 is patterned to form the electrode lines 908 of intermediate 1804. Subsequently, the exposed region of the sacrificial layer 1802 in between electrodes 908 is removed by RIE to form intermediate 1806 of FIG. 18B. Then the lower sacrificial layer 518 is removed by etching to form intermediate 1808. The remaining portions 1810 of the upper sacrificial layers directly above the lower electrodes 510 are removed by utilizing their higher differential solubility compared to the portions 1812 of sacrificial material directly above the lower supports 508. Because sacrificial material 1810 directly above the lower electrodes is much more easily accessed than sacrificial material 1812 directly above the lower supports, the material directly above the lower electrodes etches faster. Thus, by applying etchant but stopping the etching process at the appropriate time, the freely suspended, tristable junctions 914 of the target structure 1814 can be generated.

EXAMPLE 1

A junction with metallic traces 510 was created as described in FIG. 5 and was oxidized as follows:

Five standard cubic centimeters per minute (sccm) of $O_2$ was flowed over an NRAM switch, ac voltage (triangle wave) was applied to the NRAM junction (5 V amplitude, 10 kHz frequency).

Amplitudes lower than 2 V are not high enough to make the switch volatile. Amplitudes higher than 7 V frequently destroy the device (very high to infinite resistance afterwards). It was found that the switch turns volatile within a few seconds of application of voltage in the presence of the $O_2$, after which, the switch remained volatile. 5V amplitude of ac wave adequately oxidizes the electrode; however voltage amplitudes of 2 V–7 V have been successfully used for fabricating volatile devices.

ADDITIONAL EMBODIMENTS

In general, it should be noted that the feature sizes described above are suggested in view of modern manufacturing techniques. Other embodiments may be made with much smaller (or larger) sizes that reflect manufacturing capabilities.

Another embodiment of the present invention involves tristate memory. Because contact between the nanofabric ribbon and the insulation-coated electrode can be sensed, it is possible to use the three-trace device as a tristate memory device; e.g. capacitance differences can be measured between the fabric and the insulated electrode when in contact and when out of contact. Different capacitances may be related memory states. Contact between the fabric and the uncoated electrode may be detected as stated above, and this corresponds to a different memory state, and a third memory state may be detected where the fabric contacts neither electrode.

The target structures and processes described above do not exhaust the range of embodiments of the present invention. Subsequent metallization may be used to add addressing electrodes to an array of tristable junctions such as that pictured in FIG. 1. Other embodiments could use nanotube technology, whether in individual wire or belt form, to implement addressing of memory cells instead of using metallized electrodes and CMOS addressing logic (not shown). Such potential use of nanotube technology to select memory cells for reading or writing operations would further integrate nanotubes into system design and might add beneficial functionality to higher-level system design. For example, under this approach of using nanotube technology for both memory and addressing, the memory architecture could inherently store the last memory address as well as memory contents in a nonvolatile manner.

Another set of embodiments would use different materials in place of the nanotube ribbons described above. Of course, individual nanotubes could be used instead of ribbons, albeit with the disadvantages relative to ribbons discussed above. In addition, other materials with electronic and mechanical properties suitable for electromechanical switching could be envisioned. These materials would have properties similar to carbon nanotubes but with different and likely reduced tensile strength. For a material to qualify, its tensile strain and adhesion energies would need to fall within a range that allowed for bistability or tristability, and that ensured that required electromechanical switching properties exist within acceptable tolerances.

Other embodiments could feature additional electrodes consisting of n-doped silicon on top of some metal or semiconductor conductive traces. The additional electrodes would provide rectifying junctions in the ON state so that no multiple current pathways exist.

Embodiments could also feature any of various other widely accepted and used methods to prevent the occurrence of electrical crosstalk (i.e., multiple current pathways) in crossbar arrays. Tunnel barriers could be added on top of the static, lithographically fabricated electrodes to prevent the formation of ohmic ON states. In such embodiments, no leakage currents would occur at zero bias voltage, and a small bias voltage would have to be applied for any significant number of charge carriers to overcome the barrier and tunnel between crossing traces.

Additional embodiments could make use of methods to increase adhesion energies through the use of ionic, covalent or other forces to alter the interactions between the electromechanical switching elements and the electrode surfaces. Such methods can be used to extend the range of bistability and tristability within the junctions.

Further embodiments could be produced by functionalizing nanotubes with planar conjugated hydrocarbons such as pyrenes. These hydrocarbons could enhance the internal adhesion between nanotubes within the ribbons.

Moreover, many of the above benefits may be achieved by embodiments that do not utilize the "sandwich-type" of architecture of having the electromechanically-responsive element disposed between two electrodes. For example, two generally parallel traces disposed on one side of the electromechanically-responsive element may improve fault tolerance and the like.

In addition, certain embodiments used a shifted upper trace to define an opening to the sacrificial layers to facilitate the removal of the sacrificial layers. Other approaches may be used to define such openings, for example, by shaping the upper trace appropriately to define such an opening.

It will be further appreciated that the scope of the present invention is not limited to the above-described embodiments, but rather is defined by the appended claims, and that these claims will encompass modifications of and improvements to what has been described.

What is claimed is:

1. A circuit, comprising
  a first electrically conductive element;
  a second electrically conductive element; and
  a nanotube ribbon disposed between the first and second electrically conductive elements, wherein the nanotube ribbon is movable toward at least one of the first and second electrically conductive elements in response to electrical stimulus applied to at least one of the first and second electrically conductive elements and the nanotube ribbon;
  wherein one of the first and second electrically conductive elements comprises an insulative layer on a surface facing the nanotube ribbon.

2. The circuit of claim 1, wherein the first and second electrically conductive elements comprise doped silicon traces.

3. The circuit of claim 1, wherein the nanotube ribbon is of a non-woven fabric of nanotubes.

4. The circuit element of claim 1, wherein the nanotube ribbon is substantially a monolayer of nanotubes.

5. A circuit array, comprising
  a first structure having a plurality of electrically conductive elements and a plurality of support structures;
  a second structure having a plurality of electrically conductive elements and a plurality of support structures; and
  a plurality of nanotube ribbons disposed between the first and second structures, each nanotube ribbon crossing in spaced relation the corresponding electrically conductive elements of the first and second structures and thereby defining a corresponding circuit cell, and wherein a nanotube ribbon is movable within a circuit cell in response to electrical stimulus applied to at least one of the electrically conductive elements and the nanotube ribbons; and
  wherein the electrically conductive elements of at least one of the first and second structures comprise an insulative layer on a surface facing a corresponding nanotube ribbon.

6. The circuit array of claim 5 wherein the first support structure is vertically aligned with the second support structure.

7. The circuit array of claim 5 wherein the electrically conductive elements of the first structure are vertically aligned with the electrically conductive elements of the second structure.

8. The circuit array of claim 5 wherein the first support structure is vertically unaligned with the second support structure.

9. The circuit array of claim 5 wherein the electrically conductive elements of the first structure are disposed between corresponding support structures of the first structure and wherein the electrically conductive elements of the second structure have at least a portion of their widths disposed over support structures of the second structure and at least a different portion of their widths protruding past the support structures of the second structure.

10. The circuit array of claim 5, wherein the support structures of the second structure comprise an insulating material.

11. The circuit array of claim 5, wherein the support structures of the first structure comprise an insulating material.

12. The circuit array of claim 5 wherein the second structure comprises a gate dielectric layer.

13. The circuit array of claim 5 wherein the first structure comprises a gate dielectric layer.

14. The circuit array of claim 5 wherein the support structures of at least one of the first structure and the second structure comprise spin-on glass.

15. The circuit array of claim 5 wherein the support structures of at least one of the first structure and the second structure comprise silicon nitride.

16. The circuit array of claim 5 wherein the support structures of at least one of the first structure and the second structure polyimide.

17. A circuit, comprising
  a first electrically conductive element;
  a second electrically conductive element; and
  an electromechanically responsive element disposed between the first and second electrically conductive elements, wherein the electromechanically responsive element is movable toward at least one of die first and second electrically conductive elements in response to electrical stimulus applied to at least one of the first and second electrically conductive elements and the electromechanically responsive element; and wherein one of the first and second electrically conductive elements comprises an insulative layer on a surface facing the electromechanically responsive element.

18. The circuit of claim 17 wherein the electromechanically responsive element comprises a nanotube.

19. The circuit of claim 17 wherein the electromechanically responsive element comprises a ribbon of nanotube material.

20. A method of using a circuit cell having a first electrically conductive element, a second electrically conductive element, and a nanotube ribbon disposed between the first and second electrically conductive elements, the method comprising:

applying electrical stimulus to one of the first and second electrically conductive elements and to the nanotube ribbon to move the nanotube ribbon toward at least one of the first and second electrically conductive elements;

sensing electrical signals from at least one the first and second electrically conductive elements and the nanotube ribbon to determine the electrical state of the circuit cell; and applying electrical stimulus to the other of the first and second electrically conductive elements and to the nanotube ribbon to move the nanotube ribbon away from the one of the first and second electrically conductive elements which it was moved toward.

21. The method of claim 20 wherein, if the ribbon is moved toward the first electrically conductive element, the electrical state is a first state; if the ribbon is moved toward the second electrically conductive element, the electrical state is a second state; and if the ribbon is between the first and second electrically conductive elements, the electrical state is also in a second state.

* * * * *